United States Patent
Cesaretti et al.

(10) Patent No.: US 9,645,220 B2
(45) Date of Patent: May 9, 2017

(54) CIRCUITS AND METHODS FOR SELF-CALIBRATING OR SELF-TESTING A MAGNETIC FIELD SENSOR USING PHASE DISCRIMINATION

(71) Applicant: Allegro Microsystems, LLC, Worcester, MA (US)

(72) Inventors: Juan Manuel Cesaretti, Ciudad de Buenos Aires (AR); Octavio Alpago, Ciudad de Buenos Aires (AR); Alejandro G. Milesi, La Lucila Buenos Aires (AR); Franco Noel Martin Pirchio, Ciudad de Buenos Aires (AR); Hernan D. Romero, Buenos Aires (AR); Bruno Luis Uberti, Ciudad de Buenos Aires (AR)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 14/255,166

(22) Filed: Apr. 17, 2014

(65) Prior Publication Data
US 2015/0301149 A1    Oct. 22, 2015

(51) Int. Cl.
*G01R 35/00* (2006.01)
*G01R 33/07* (2006.01)
*G01R 33/00* (2006.01)

(52) U.S. Cl.
CPC ....... *G01R 35/005* (2013.01); *G01R 33/0035* (2013.01); *G01R 33/07* (2013.01); *G01R 33/075* (2013.01)

(58) Field of Classification Search
CPC ......... G01R 35/00; G01R 33/07; G01R 33/06
See application file for complete search history.

(56) References Cited

U.S. PATENT DOCUMENTS

| | | | |
|---|---|---|---|
| 4,236,832 A | 12/1980 | Komatsu et al. | |
| 4,438,347 A | 3/1984 | Gehring | |
| 4,752,733 A | 6/1988 | Petr et al. | |
| 4,758,943 A | 7/1988 | Aström et al. | |
| 4,760,285 A | 7/1988 | Nelson | |
| 4,767,989 A * | 8/1988 | Meyer ................... | G01D 5/147 174/541 |

(Continued)

FOREIGN PATENT DOCUMENTS

| | | |
|---|---|---|
| CN | 1501093 A | 6/2004 |
| CN | 101023367 A | 8/2007 |

(Continued)

OTHER PUBLICATIONS

PCT Search Report and Written Opinion of the ISA dated Aug. 4, 2015; for PCT Pat. App. No. PCT/US2015/026071; 16 pages.

(Continued)

*Primary Examiner* — Huy Q Phan
*Assistant Examiner* — Alvaro Fortich
(74) *Attorney, Agent, or Firm* — Daly, Crowley, Mofford & Durkee, LLP

(57) ABSTRACT

A magnetic field sensor has a reference magnetic field channel and an external magnetic field channel. The magnetic field sensor uses phase discrimination to isolate a reference-magnetic-field signal component from an external magnetic field signal component in the two channels.

34 Claims, 9 Drawing Sheets

(56) References Cited

U.S. PATENT DOCUMENTS

| | | | |
|---|---|---|---|
| 4,823,075 A | 4/1989 | Alley | |
| 4,833,406 A | 5/1989 | Foster | |
| 4,970,411 A | 11/1990 | Halg et al. | |
| 5,247,278 A | 9/1993 | Pant et al. | |
| 5,329,416 A | 7/1994 | Ushiyama et al. | |
| 5,343,143 A | 8/1994 | Voisine et al. | |
| 5,412,255 A | 5/1995 | Wallrafen | |
| 5,424,558 A | 6/1995 | Borden et al. | |
| 5,469,058 A | 11/1995 | Dunnam | |
| 5,517,112 A * | 5/1996 | Vig | G01D 3/032 307/116 |
| 5,521,501 A | 5/1996 | Dettmann et al. | |
| 5,621,319 A | 4/1997 | Bilotti et al. | |
| 5,640,090 A | 6/1997 | Furuya et al. | |
| 5,844,140 A | 12/1998 | Seale | |
| 5,936,498 A * | 8/1999 | Takeshima | G01R 33/3806 324/318 |
| 6,011,770 A | 1/2000 | Tan | |
| 6,211,673 B1 * | 4/2001 | Gerber | G01Q 60/56 324/260 |
| 6,351,506 B1 | 2/2002 | Lewicki | |
| 6,392,478 B1 | 5/2002 | Mulder et al. | |
| 6,433,545 B1 | 8/2002 | Kunze et al. | |
| 6,436,748 B1 | 8/2002 | Forbes et al. | |
| 6,437,558 B2 | 8/2002 | Li et al. | |
| 6,750,644 B1 | 6/2004 | Berkcan | |
| 6,853,178 B2 | 2/2005 | Hayat-Dawoodi | |
| 6,896,407 B2 | 5/2005 | Nomiyama et al. | |
| 6,917,321 B1 | 7/2005 | Haurie et al. | |
| 7,038,448 B2 | 5/2006 | Schott et al. | |
| 7,190,784 B2 | 3/2007 | Li | |
| 7,259,545 B2 | 8/2007 | Stauth et al. | |
| 7,292,095 B2 | 11/2007 | Burt et al. | |
| 7,319,319 B2 | 1/2008 | Jones et al. | |
| 7,323,870 B2 | 1/2008 | Tatschl et al. | |
| 7,325,175 B2 | 1/2008 | Momtaz | |
| 7,345,470 B2 | 3/2008 | Suzuki | |
| 7,425,821 B2 | 9/2008 | Monreal et al. | |
| 7,474,093 B2 | 1/2009 | Ausserlechner | |
| 7,518,354 B2 | 4/2009 | Stauth et al. | |
| 7,598,601 B2 | 10/2009 | Taylor et al. | |
| 7,605,647 B1 | 10/2009 | Romero et al. | |
| 7,635,993 B2 | 12/2009 | Boeve | |
| 7,694,200 B2 | 4/2010 | Forrest et al. | |
| 7,701,208 B2 | 4/2010 | Nishikawa | |
| 7,729,675 B2 | 6/2010 | Krone | |
| 7,746,056 B2 | 6/2010 | Stauth et al. | |
| 7,746,065 B2 | 6/2010 | Pastre et al. | |
| 7,764,118 B2 | 7/2010 | Kusuda et al. | |
| 7,769,110 B2 | 8/2010 | Momtaz | |
| 7,800,389 B2 | 9/2010 | Friedrich et al. | |
| 7,923,996 B2 | 4/2011 | Doogue et al. | |
| 7,936,144 B2 | 5/2011 | Vig et al. | |
| 7,961,823 B2 | 6/2011 | Kolze et al. | |
| 7,990,209 B2 | 8/2011 | Romero | |
| 8,030,918 B2 | 10/2011 | Doogue et al. | |
| 8,128,549 B2 | 3/2012 | Testani et al. | |
| 8,134,358 B2 | 3/2012 | Charlier et al. | |
| 8,203,329 B2 | 6/2012 | Hohe et al. | |
| 8,447,556 B2 | 5/2013 | Friedrich et al. | |
| 8,542,010 B2 | 9/2013 | Cesaretti et al. | |
| 8,576,589 B2 | 11/2013 | Melanson et al. | |
| 8,680,846 B2 | 3/2014 | Cesaretti et al. | |
| 8,692,546 B2 | 4/2014 | Cesaretti et al. | |
| 2002/0084923 A1 | 7/2002 | Li | |
| 2003/0038675 A1 | 2/2003 | Gailus et al. | |
| 2003/0102909 A1 | 6/2003 | Motz | |
| 2006/0202692 A1 | 9/2006 | Tatschl et al. | |
| 2007/0110199 A1 | 5/2007 | Momtaz et al. | |
| 2007/0247141 A1 | 10/2007 | Pastre et al. | |
| 2007/0285089 A1 | 12/2007 | Ibuki et al. | |
| 2008/0048772 A1 | 2/2008 | Nishikawa | |
| 2008/0094055 A1 | 4/2008 | Monreal et al. | |
| 2008/0110987 A1 | 5/2008 | Cato et al. | |
| 2008/0137784 A1 | 6/2008 | Krone | |
| 2008/0238410 A1 | 10/2008 | Charlier et al. | |
| 2008/0265880 A1 | 10/2008 | Nishikawa | |
| 2008/0278158 A1 * | 11/2008 | Granig | B82Y 25/00 324/247 |
| 2009/0001964 A1 | 1/2009 | Strzalkowski et al. | |
| 2009/0001972 A1 | 1/2009 | Fernandez et al. | |
| 2009/0033324 A1 | 2/2009 | Tomida et al. | |
| 2009/0085706 A1 | 4/2009 | Baarman et al. | |
| 2009/0212765 A1 | 8/2009 | Doogue et al. | |
| 2009/0237075 A1 * | 9/2009 | Koss | G01R 33/098 324/252 |
| 2009/0295350 A1 | 12/2009 | Yamada | |
| 2010/0117638 A1 | 5/2010 | Yamashita et al. | |
| 2010/0211347 A1 | 8/2010 | Friedrich et al. | |
| 2010/0301791 A1 | 12/2010 | Watanabe et al. | |
| 2011/0018533 A1 | 1/2011 | Cesaretti et al. | |
| 2011/0031965 A1 * | 2/2011 | Saruki | G01D 3/036 324/207.25 |
| 2011/0048102 A1 | 3/2011 | Fernandez et al. | |
| 2011/0133723 A1 | 6/2011 | Forsyth et al. | |
| 2011/0298448 A1 | 12/2011 | Foletto et al. | |
| 2012/0016614 A1 | 1/2012 | Hohe et al. | |
| 2012/0112695 A1 | 5/2012 | Nishi et al. | |
| 2012/0274314 A1 * | 11/2012 | Cesaretti | G01R 33/0035 324/202 |
| 2012/0313635 A1 | 12/2012 | Daubert | |
| 2013/0093412 A1 | 4/2013 | Anelli et al. | |
| 2013/0214774 A1 * | 8/2013 | Cesaretti | G01R 33/0023 324/251 |
| 2014/0009144 A1 | 1/2014 | Romero | |
| 2014/0312883 A1 | 10/2014 | Friedrich et al. | |

FOREIGN PATENT DOCUMENTS

| | | |
|---|---|---|
| CN | 200986484 Y | 12/2007 |
| DE | 195 39 458 A1 | 4/1997 |
| DE | 196 06 826 A1 | 8/1997 |
| DE | 10 2005 047 413 A1 | 9/2006 |
| DE | 10 2006 037 226 A1 | 2/2008 |
| DE | 10 2007 041 230 B3 | 4/2009 |
| EP | 0 289 414 A3 | 11/1988 |
| EP | 0 338 122 | 10/1989 |
| EP | 0 357 013 A2 | 3/1990 |
| EP | 0 357 013 A3 | 3/1990 |
| EP | 0 289 414 A2 | 11/1998 |
| EP | 1 637 898 A1 | 3/2006 |
| EP | 1637898 A1 | 3/2006 |
| EP | 1 850 143 A1 | 10/2007 |
| EP | 1 679 524 A1 | 7/2008 |
| GB | 2 276 727 A | 10/1994 |
| JP | A 51-117080 | 10/1976 |
| JP | 61-48777 | 3/1986 |
| JP | S 6148777 A | 3/1986 |
| JP | SHO 61-48777 | 3/1986 |
| JP | H03-176682 | 7/1991 |
| JP | 03-248611 | 11/1991 |
| JP | H03-248611 A | 11/1991 |
| JP | A 06-317637 | 11/1994 |
| JP | 2000-55999 A | 2/2000 |
| JP | 2002-213992 A | 7/2002 |
| JP | 2004-234589 A | 8/2004 |
| JP | 2006-123012 A | 5/2006 |
| JP | 2006-126012 A | 5/2006 |
| JP | 2008-513762 | 5/2008 |
| JP | 2008-513762 A | 5/2008 |
| JP | 2010-500536 A | 1/2010 |
| JP | 4840481 B2 | 1/2011 |
| JP | 2011-052036 A | 3/2011 |
| KR | 10-2007-0060096 A | 6/2007 |
| TW | 200640135 | 11/2006 |
| WO | WO 96/02849 A1 | 2/1996 |
| WO | WO 2004/072672 | 8/2004 |
| WO | WO 2006/035342 A1 | 4/2006 |
| WO | WO 2006/056829 | 6/2006 |
| WO | WO 2007/138508 A1 | 12/2007 |
| WO | WO 2008/048379 A1 | 4/2008 |
| WO | WO 2008/123144 A1 | 10/2008 |
| WO | WO 2009/002609 | 12/2008 |

(56) References Cited

FOREIGN PATENT DOCUMENTS

| WO | WO 2009/108422 A2 | 9/2009 |
|---|---|---|
| WO | WO 2009/108422 A3 | 9/2009 |
| WO | WO 2010/096367 A1 | 8/2010 |
| WO | WO 2010/147713 | 12/2010 |
| WO | WO 2011/011479 | 1/2011 |
| WO | WO 2012/001612 | 1/2012 |

OTHER PUBLICATIONS

Korean Notice of Allowance dated Jul. 31, 2015; for Korean Pat. App. No. 10-2014-7033792; 5 pages.
Response filed Jul. 30, 2014; of Office Action dated Jul. 3, 2014 for U.S. Appl. No. 13/398,127; 17 pages.
Letter to Yuasa and Hara dated Jun. 19, 2014; for Japanese Pat. App. No. 2012-521746; 4 pages.
Letter to Yuasa and Hara dated Aug. 21, 2014; for Japanese Pat. App. No. 2012-521746; 1 page.
Japanese Argument filed on Jul. 3, 2014; for Japanese Pat. App. No. 2012-521746; 4 pages.
Taiwanese Marked-Up Specification filed on Aug. 28, 2014; for Taiwanese Pat. App. No. 102102201; 72 pages.
European Decision to Grant dated Aug. 14, 2014; for EP Pat. App. No. 13 169 661.9; 7 pages.
PCT International Preliminary Report on Patentability of the ISA dated Aug. 28, 2014, for PCT Pat. App. No. PCT/US2013/021143; 9 pages.
Letter to Yuasa and Hara dated Jan. 9, 2015; for Japanese Pat. App. No. 2010-547666; 6 pages.
Claims filed Jan. 27, 2015 in Response to Japanese Office Action; for Japanese Pat. App. No. 2010-547666; 5 pages.
Notice of Allowance dated Jun. 1, 2015; for U.S. Appl. No. 14/321,347; 10 pages.
Korean Notice to Submit a Response dated Sep. 30, 2014; for Korean Pat. App. No. 10-2010-7019498; 5 pages.
European Notice of Allowance dated Aug. 29, 2014; for European Pat. App. No. 12 719 134.4; 7 pages.
Taiwan Notice of Allowance dated Sep. 26, 2014; for Taiwan Pat. App. No. 102102201; 2 pages.
Allegro MicroSystem, LLC; A3981 Automotive, Programmable Stepper Driver; datasheet; Jan. 2013; 43 pages.
Japanese Allowed Claims received May 25, 2015; for Japanese Pat. App. No. 2010-547666; 5 pages.
Korean Notice of Allowance with Allowed Claims (English Translation); dated Apr. 20, 2015; for Korean Pat. App. No. 10-2010-7019498; 12 pages.
Office Action dated Jan. 9, 2015; for U.S. Appl. No. 14/321,347; 29 pages.
Response filed Mar. 2, 2015; to Office Action dated Oct. 30, 2014; for U.S. Appl. No. 13/177,075; 16 pages.
Korean Notice to Submit a Response dated Jan. 30, 2015; for Korean Pat. App. No. 5-2002-043492-2; 6 pages.
Letter to 21$^{st}$ Century Patent & Law Firm dated Mar. 10, 2015; for Korean Pat. App. No. 10-2014-7033792; 2 pages.
Response filed Mar. 18, 2015; for Office Action dated Nov. 24, 2014; 28 pages.
European Response filed Mar. 20, 2015; for European Pat. App. No. 13703914.5; 34 pages.
Letter from 21$^{st}$ Century Patent & Law Firm dated Mar. 23, 2015; for Korean Pat. App. No. 10-2014-7033792; 1 page.
Korean Response to Notice of Reasons for Refusal dated Mar. 23, 2015; for Korean Pat. App. No. 10-2014-7033792; 11 page.
Japanese Notice of Reasons for Rejection dated Sep. 29, 2014; for Japanese Pat. App. No. 2010-54766; 4 pages.
Korean Notice to Submit a Response (with English translation) dated Sep. 30, 2014; for Korean Pat. App. No. 10-2010-7019498; 10 pages.
Letter to Yuasa and Hara dated Aug. 12, 2014; Japanese application corresponding to PCT Pat. App. PCT/US2013/021143; 2 pages.
Letter from Yuasa and Hara dated Nov. 14, 2014; for Japanese application corresponding to PCT Pat. App. PCT/US2013/021143; 1 pages.
Japanese Claims as filed (English translation) received Nov. 14, 2014; for Japanese application corresponding to PCT Pat. App. PCT/US2013/021143; 8 pages.
Letter to 21$^{st}$ Century Patent & Law Firm (with Amendment from related U.S. case) dated Nov. 18, 2014; for Korean Pat. App. No. 10-2010-701498; 20 pages.
Korean Response to Notice Reasons for Refusal dated Dec. 1, 2014; for Korean Pat. App. No. 10-2010-701498; 32 pages.
Office Action dated Nov. 24, 2014; for U.S. Appl. No. 13/398,127; 56 pages.
Response filed Apr. 28, 2015; to Office Action dated Jan. 9, 2015; for U.S. Appl. No. 14/321,347; 9 pages.
European Decision to Grant a European Patent dated Apr. 23, 2015; for European Pat. App. No. 12719134.4; 2 pages.
Letter to Taiwan International Patent & Law Offices dated Jul. 30, 2014; for Taiwan Pat. App. No. 102102201; 73 pages.
European Response to Search Report received May 23, 2014; for European Patent Application No. EP 12719134.4; 20 pages.
Notice of Allowance dated Jul. 28, 2015; for U.S. Appl. No. 13/398,127; 22 pages.
U.S. Appl. No. 14/264,522, Apr. 29, 2014, McIntosh et al.
European Decision to Grant dated Dec. 18, 2014; for European Pat. App. No. 13169661.9; 2 pages.
Letter to Yuasa and Hara dated Dec. 5, 2014; for Japanese Pat. App. No. 2014-508370; 2 pages.
Japanese Claims (English translation) as filed with Request for Examination on Dec. 11, 2014; for Japanese Pat. App. No. 2014-508370; 5 pages.
U.S. Appl. No. 13/743,451, Jan. 17, 2013, Friedrich et al.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "Limits of Offset Cancellation by the Principle of Spinning Current Hall Probe;" Proceedings of IEEE Sensors; Oct. 2004; pp. 1117-1120.
Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007, pp. 1326-1334.
Barrenttino, et al.; "CMOS-Based Monolithic controllers for Smart Sensors Comprising Micromembranes and Microcantilevers;" IEEE Transactions on Circuits and Systems-I Regular Papers vol. 54, No. 1; Jan. 2007; pp. 141-152.
Baschirotto et al. ; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Blagojevic et al.; "FD SOI Hall Sensor Electronics Interfaces for Energy Measurement;" Microelectronics Journal 37; Sep. 2006; pp. 1576-1583.
Cesaretti et al.; "Effect of Stress Due to Plastic Package Moisture Absorption in Hall Sensors;" IEEE Transactions on Magnets; vol. 45; No. 1; Oct. 2009; pp. 4482-4485.
Demierre, et al.; "Reference Magnetic Actuator for Self-Calibration of a Very Small Hall Sensor Array;" Sensors and Actuators A97-98; Apr. 2002; pp. 39-46.
Frick, et al.; "CMOS Microsystem for AC Current Measurement with Galvanic Isolation;" IEEE Sensors Journal; vol. 3, No. 6; Dec. 2003; pp. 752-760.
Halg; "Piezo-Hall Coefficients of n-Type Silicon;" Journal of Applied Physics; vol. 64, No. 1; Jul. 1, 1988; pp. 276-282.

(56) References Cited

OTHER PUBLICATIONS

Hosticka; "CMOS Sensor Systems;" Sensors and Actuators A66; Apr. 1998; pp. 335-341.
Kanda et al.; "The Piezo-Hall Effect in n-Silicon;" $22^{nd}$ International Conference on the Physics of Semiconductors; vol. 1, Jan. 1995; pp. 89-92.
Kayal et al.; "Automatic Calibration of Hall Sensor Microsystems;" Microelectronics Journal 37; Sep. 2006; pp. 1569-1575.
Krammer et al.; "A Hall effect sensors network insensitive to mechanical stress;" Proceedings of IEEE Sensors; vol. 3, Oct. 2004; pp. 1071-1074.
Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.
Manic et al.; "Short and Long-Term Stability Problems of Hall Plates in Plastic Packages;" IEEE $38^{th}$ Annual International Reliability Physics Symposium; Apr. 2000; pp. 225-230.
Manic; "Drift in Silicon Integrated Sensors and Circuits Due to the Thermo-Mechanical Stresses;" Lausanne, École Polytechnique Fédérale De Lausanne 2000; 176 pages.
Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.
Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.
Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.
Munter; "A Low-offset Spinning-current Hall Plate;" Sensors and Actuators A21-A23; 1990; pp. 742-746.
Munter; "Electronic Circuitry for a Smart Spinning-current Hall Plate with Low Offset;" Sensors and Actuators A; Jun. 1991; pp. 747-751.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
Popovic; "Sensor Microsystems;" Proc. $20^{th}$ International Conference on Microelectronics (MWIL 95); vol. 2, NIS, Serbia, Sep. 12-14, 1995; pp. 531-537.
Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping;" $5^{th}$ IEEE Conference on Sensors, Oct. 2007; pp. 1131-1134.
Ruther et al.; "Theromagnetic Residual Offset in Integrated Hall Plates;" IEEE Sensors Journal; vol. 3, No. 6; Dec. 2003; pp. 693-699.
Sargent; "Switched-capacitor IC controls feedback loop;" EDN; Design Ideas; Feb. 17, 2000; pp. 154 and 156.
Schneider, et al.; "Temperature Calibration of CMOS Magnetic Vector Probe for Contactless Angle Measurement System;" IEDM; Dec. 1996; pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronics Compass with Microcontroller;" IEEE Journal of Solid-State Circuits; vol. 42, No. 12; Dec. 2007; pp. 2923-2933.
Simon et al.; "Autocalibration of Silicon Hall Devices;" $8^{th}$ International Conference on Solid-State Sensors and Actuators; vol. 2; Jun. 25, 1995; pp. 237-240.
Steiner et al; Offset Reduction in Hall Devices by Continuous Spinning Current Method; Sensors and Actuators A66; 1998; pp. 167-172.
Steiner: "Double-Hall Sensor with Self-Compensated Offset;" Electron Devices Meeting; IDSM '97 Technical Digest; Dec. 7-10, 1997; pp. 911-914.
Stellrecht et al.; Characterization of Hygroscopic Swelling Behavior of Mold Compounds and Plastic Packages; IEEE Transactions on Components and Packaging Technoiogies; vol. 27, No. 3; Sep. 2004; pp. 499-506.
Trontelj et al; "CMOS Integrated Magnetic Field Source Used as a Reference in Magnetic Field Sensors on Common Substrate;" WEP 1-6; IMTC; May 1994; pp. 461-463.
Tian et at; "Multiple Sensors on Pulsed Eddy-Current Detection for 3-D Subsurface Crack Assessment;" IEEE Sensors Journal, vol. 5, No. 1; Feb. 2005; pp. 90-96.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.
Zou et al.; "Three-Dimensional Die Surface Stress Measurements Plastic Packages;" 48th Electronic Components and Technology Conference; May 25, 1998; pp. 1223-1234.
Office Action; dated Feb. 2, 2011; for U.S. Appl. No. 12/959,672; 13 pages.
Response filed on May 24, 2011; for Office Action dated Feb. 2, 2011; for U.S. Appl. No. 12/959,672; 8 pages.
Notice of Allowance; dated Feb. 11, 2011; for U.S. Appl. No. 12/037,393; 7 pages.
Office Action dated Jul. 6, 2012: for U.S. Appl. No. 12/706,318, filed Feb. 16, 2010; 24 pages.
Response filed Sep. 27, 2012; for U.S. Appl. No. 12/706,318, filed Feb. 16, 2010; 12 pages.
Supplemental Response filed Oct. 12, 2012; for U.S. Appl. No. 12/706,318, filed Feb. 16, 2010; 12 pages.
Notice of Allowance; dated Dec. 10, 2012; for U.S. Appl. No. 12/706,318; 9 pages.
Office Action dated Jun. 12, 2013; for U.S. Appl. No. 13/743,451; 24 pages.
Response filed Oct. 8, 2013; to Office Action dated Jun. 12, 2013; for U.S. Appl. No. 13/743,451; 12 pages.
Notice of Allowance dated Dec. 24, 2013; for U.S. Appl. No. 13/743,451; 24 pages.
312 Amendment filed Feb. 7, 2014; for U.S. Appl. No. 13/743,451; 7 pages.
Response dated Mar. 21, 2004; to 312 Amendment filed on Feb. 11, 2014; 4 pages.
Office Action Dated Sep. 11, 2012 from U.S. Appl. No. 12/840,324; 30 pages.
Response filed Dec. 11, 2012; to Office Action dated Sep. 11, 2012; for U.S. Appl. No. 12/840,324; 15 pages.
Final Office Action dated Feb. 12, 2013 for U.S. Appl. No. 12/840,324; 19 pages.
Response filed May 13, 2013; to Final Office Action dated Feb. 12, 2013; ; for U.S. Appl. No. 12/840,324; 12 pages.
Notice of Allowance; dated May 24, 2013; for U.S. Appl. No. 12/840,324; 12 pages.
Corrected Notice of Allowance; dated Aug. 9, 2013; for U.S. Appl. No. 12/840,324; 6 pages.
Notice of Allowance dated Nov. 14, 2013; for U.S. Appl. No. 13/969,702; 26 pages.
Office Action dated Jun. 11, 2013; for U.S. Appl. No. 13/095,371; 31 pages.
Response filed Sep. 27, 2013; to Office Action dated Jun. 11, 2013; for U.S. Appl. No. 13/095,371; 26 pages.
Notice of Allowance dated Oct. 28, 2013; for U.S. Appl. No. 13/095,971; 19 pages.
Office Action dated Jul. 3, 2014; for U.S. Appl. No. 13/398,127; 73 pages.

(56) References Cited

OTHER PUBLICATIONS

Chinese Office Action; dated Aug. 29, 2012; for Chinese Pat. App. No. 200980106535.4; 4 pages.
Chinese Office Action (Translated into English); dated Aug. 29, 2012; for Chinese Pat. App. No. 200980106535.4; 4 pages.
Chinese Letter from NTD Patent & Trademark Agency Limited; dated Oct. 10, 2012; for Chinese Pat. App. No. 200980106535.4; 13 pages.
Chinese Letter to NTD Patent and Trademark Agency Ltd.; dated Dec. 11, 2012; with instructions to file Response to Official Action; for Chinese Pat. App. No. 200980106535.4; 3 pages.
Chinese Letter from NTD Patent and Trademark Agency Ltd.; dated Jan. 19, 2013; enclosing Response to Official Action; for Chinese Pat. App. No. 200980106535.4; 14 pages.
Chinese Office Action (Engl. Translation) dated Apr. 15, 2013; for CN Pat. App. No. 200980106565.4; 5 pages.
Chinese Letter NTD Patent and Trademark Agency; dated Jun. 19, 2013; for Chinese Pat. App. No. 200980106535.4; 11 pages.
Chinese Response to Office Action received Jul. 11, 2013; for Chinese Pat. App. No. 200980106535.4; 12 pages.
Chinese Claims from Chinese Office Action dated Nov. 7, 2013 (w/English translation); for Chinese Pat. App. No. 200980106535.4; 8 pages.
Chinese Office Action dated Nov. 7, 2013 (w/English translation); for Chinese Pat. App. No. 200980106535.4; 9 pages.
Chinese Letter to NTD Patent and Trademark Agency, Ltd. dated Dec. 16, 2013; for Chinese Pat. App. No. 200980106535.4; 10 pages.
Chinese Letter from NTD Patent and Trademark Agency, Ltd. dated Jan. 7, 2014; for Chinese Pat. App. No. 200980106535.4; 1 page.
Chinese Response to Office Action received Jan. 7, 2014; for Chinese Pat. App. No. 200980106535.4; 10 pages.
Chinese Notice of Completing Formalities (including English translation) and Search Report dated Mar. 7, 2014; for Chinese Pat. App. No. 200980106535.4; 8 pages.
EP Official Communication; dated Feb. 23, 2012; for EP. Pat. App. No. 10739429.8; 2 pages.
European Response to European Written Opinion; filed on Sep. 4, 2012; for EP Pat. App. No. 10739429.8; 11 pages.
European Decision to Grant a European Patent; dated Sep. 5, 2013; for European Pat. App. No. 10739429.8; 2 pages.
European Search Report; dated Jul. 4, 2013; for EP Pat. App. No. 13169661.9; 2 pages.
European Response file Mar. 4, 2014; to Official Communication dated Sep. 9, 2013; for European Pat. App. No. 13169661.9; 10 pages.
German Letter to Kuhnen & Wacker dated Jan. 20, 2014, with enclosures; for DE Pat. App. No. 112010000848.5; 14 pages.
German Letter from Kuhen and Wacker dated May 26, 2014 for German Patent Application No. 11 2011 000 848 5 (with claims in English and German) 50 pages.
German Office Action; dated Sep. 23, 2013; for German Pat. App. No. 11 2010 000 848.5; 12 pages.
Japanese Notice of Reasons for Rejection (English translation); dated Apr. 4, 2013; for JP Pat. App. No. 2010-547666; 4 pages.
Japanese Letter from Yuasa & Hara; dated May 27, 2013; for JP Pat. App. No. 2010-547666; 2 pages.
Japanese Response, Argument and Amendment (in Japanese); dated Jul. 3, 2013; for Japanese Pat. App. No. 2010-547666; 6 pages.
Japanese Claims for Argument and Amendment (in English); dated Jul. 3, 2013; for Japanese Pat. App. No. 2010-547666; 5 pages.
Japanese Letter from Yuasa and Hara; dated Oct. 8, 2013; for Japanese Pat. App. No. 2010-547666; 2 pages.
Japanese Notice of Reasons for Rejection (English translation) dated Nov. 26, 2013; for JP Pat. App. No. 2010-547666; 2 pages.
Japanese Notice of Reasons for Rejection dated Mar. 4, 2014; for Japanese Pat. App. No. 2012-5210746; 2 pages.
Japanese Amendment; dated Jun. 12, 2013; for Japanese Pat. App. No. 2012-521746; 5 pages.

Japanese Letter from Yuasa and Hara; dated Aug. 6, 2013; for Japanese Pat. App. No. 2012-521746; 6 pages.
Taiwan Office Action with Taiwan Search Report Received Jun. 13, 2014 (English Translation) for Patent Application No. 102102201 14 pages.
PCT International Preliminary Report on Patentability and Written Opinion mailed Sep. 10, 2010 for PCT/US2009/031776.
PCT Search Report and Written Opinion of the ISA for PCT/US2009/031776 dated Oct. 23, 2009.
PCT Search Report and Writted Opinion of the ISA for PCT/US2010/024256 dated Aug. 11, 2010.
PCT International Preliminary Report on Patentability and Written Opinion of the ISA for PCT Pat. App. No. PCT/US2010/024256; dated Sep. 1, 2011; 9 pages.
PCT Search Report and Writted Opinion of the ISA for PCT/US2010/042694 dated Sep. 27, 2010.
PCT International Preliminary Report on Patentability and Written Opinion of the ISA; dated Feb. 2, 2012; for PCT Pat. App. No. PCT/US2010/042694; 11 sheets.
PCT Search Report and Written Opinion of the ISA for PCT Pat. App. No. PCT/US2012/032315; dated Jun. 22, 2012; 16 pages.
PCT International Preliminary Report on Patentability and Written Opinion of the ISA dated Nov. 7, 2013; for PCT Pat. App. No. PCT/US2012/032315; 13 pages.
PCT Search Report and Written Opinion; dated May 27, 2013; for PCT Pat. App. No. PCT/US2013/021143; 13 pages.
U.S. Pat. No. 7,923,996; issued on Apr. 12, 2011; Part 1 of 5; 300 pages.
U.S. Pat. No. 7,923,996; issued on Apr. 12, 2011; Part 2 of 5; 300 pages.
U.S. Pat. No. 7,923,996; issued on Apr. 12, 2011; Part 3 of 5; 300 pages.
U.S. Pat. No. 7,923,996; issued on Apr. 12, 2011; Part 4 of 5; 300 pages.
U.S. Pat. No. 7,923,996; issued on Apr. 12, 2011; Part 5 of 5; 279 pages.
U.S. Pat. No. 8,030,918; issued on Oct. 4, 2011; 534pages.
U.S. Appl. No. 12/706,318; Part 1 of 15; 350 pages.
U.S. Appl. No. 12/706,318; Part 2 of 15; 350 pages.
U.S. Appl. No. 12/706,318; Part 3 of 15; 350 pages.
U.S. Appl. No. 12/706,318; Part 4 of 15; 350 pages.
U.S. Appl. No. 12/706,318; Part 5 of 15; 350 pages.
U.S. Appl. No. 12/706,318; Part 6 of 15; 350 pages.
U.S. Appl. No. 12/706,318; Part 7 of 15; 350 pages.
U.S. Appl. No. 12/706,318; Part 8 of 15; 350 pages.
U.S. Appl. No. 12/706,318; Part 9 of 15; 350 pages.
U.S. Appl. No. 12/706,318; Part 10 of 15; 350.
U.S. Appl. No. 12/706,318; Part 11 of 15; 350.
U.S. Appl. No. 12/706,318; Part 12 of 15; 350.
U.S. Appl. No. 12/706,318; Part 13 of 15; 350.
U.S. Appl. No. 12/706,318; Part 14 of 15; 350.
U.S. Appl. No. 12/706,318; Part 15 of 15; 69pages.
Letter from Yuasa and Hara dated Jan. 28, 2016; For Japanese Pat. App. No. JP 2015-013206; 3 pages.
Japanese Notice of Reasons for Rejection dated Jan. 4, 2016; For Japanese Pat. App. No. 2015-013206; 7 pages.
Letter from Yuasa and Hara dated Feb. 1, 2016; For Japanese Pat. App. No. 2014-508370; 1 page.
Letter from Yuasa and Hara dated Mar. 25, 2016; For Japanese Pat. App. No. 2015-013206; 1 page.
Response 2016 with English Claims dated Mar. 17, 2016 to Japanese Office Action; For Japanese Pat. App. No. 2015-013206; 7 pages.
Letter from Yuasa and Hara dated Dec. 14, 2015; For Japanese Pat. App. No. 2014-557634; 1 page.
Letter from Yuasa and Hara dated Nov. 24, 2015; For Japanese Pat. App. No. 2014-508370; 3 pages.
Japanese Office Action with English translation and English Claims dated Oct. 23, 2015; for Japanese Pat. App. No. 2014-508370; 16 pages.
Non-Final Office Action dated Apr. 14, 2016; for U.S. Appl. No. 14/264,522; 60 pages.

(56) References Cited

OTHER PUBLICATIONS

Japanese Office Action with English translation; dated May 25, 2016; Jap Pat. App. No. 2014-508370; 5 pages.
Japanese Current Claims (English translation); for Jap Pat. App. No. 2014-508370; 5 pages.
On Semiconductor, "AND8093/D Current Sensing Power MOSFETs", Jul. 2002; pp. 1-12.
Taiwanese Search Report (with English translation) dated Aug. 2, 2016; for Taiwanese Pat. App. No. 104111440; 2 pages.
Taiwanese Office Action (with English translation) dated Sep. 5, 2016; for Taiwanese Pat. App. No. 104111440; 26 pages.
Letter from Japanese Associate dated Sep. 27, 2016 indication Notice of Appeal filed in Japan and enclosing a Current Claims dated Aug. 29, 2016; for Japanese Patent Application No. 2015-013206; 3 pages.
Response to Notice of Appeal with English Claims filed Sep. 26, 2016 for Japanese Application No. 2014-508370; 18 pages.
PCT International Preliminary Report for PCT Application No. PCT/US2015/026071 dated Oct. 27, 2016; 13 pages.
The Korean Intellectual Property Office Notice of Allowance (w/ English Translation) and Allowed Claims dated Sep. 22, 2016 related to Korean Patent Application No. 10-2012-7004427; 10 Pages.
Notice of Reason for Rejection and Claims Now on File from Japanese Patent Office dated Sep. 20, 2016; regarding Japanese Patent Application No. 2014-557634; 12 pages.
PCT International Preliminary Report on Patentability for Application No. PCT/US2015/026332 dated Nov. 10, 2016; 10 pages.
Letter from Yuasa and Hara dated Dec. 8, 2016 regarding Japanese Pat. Appl. No. 2014-557634; 1 page.
Claims now on file for Japanese Pat. Appl. No. 2014-557634 filed with the Japanese Patent Office on Nov. 22, 2016; 9 pages.
Office Action dated Dec. 2, 2016 for U.S. Appl. No. 14/264,522; 19 pages.
Response to Taiwanese Office Action and English Specification and Claims amended filed Dec. 6, 2016 for Taiwanese Application No. 104111440; 33 pages.
Response to Non-Final Office Action dated Apr. 14, 2016 corresponding to U.S. Appl. No. 14/264,522, filed Jul. 14, 2016; 16 Pages.
Letter to $21^{st}$ Century dated Jul. 7, 2016 2016 for Korean Patent Application No. 10-2012-7004427; 5 pages.
Letter from $21^{st}$ Century dated Jul. 15, 2016 for Korean Patent Application No. 10-2012-7004427; 1 page.
Response (w/ English translation) filed Jul. 15, 2016 to Korean Office Action dated May 17, 2016 for Korean Patent Application No. 10-2012-7004427; 38 pages.
Korean office action (with English translation) dated May 17, 2016 for Korean application No. 10-2012-7004427; 28 Pages.
Taiwanese Office Action (with English Translation) dated Jan. 19, 2017 including Search Report; for Taiwanese Pat. App. No. 104111440; 27 pages.
Translation of Examiner's Pre-Trial Report filed re: Yuasa and Hara Letter dated Jan. 13, 2017 for JP Pat. Appl. No. 2014-508370; 5 pages.
Claims Now on File for re: Yuasa and Hara Letter dated Jan. 13, 2017 for JP Pat. Appl. No. 2014-508370; 5 pages.
English Translation of Report of Re-Examination before Appeal dated Nov. 28, 2016 for JP Appl. No. 2015-013206; 3 pages.
Letter to Yuasa and Hara dated Feb. 17, 2017 for JP Pat. Appli. No. 2015-013206; 3 pages.
Letter to Yuasa and Hara regarding Appeal dated Feb. 7, 2017 for JP Pat. Appl. No. 2014-508370; 5 pages.
Letter from Yuasa and Hara regarding Appeal dated Feb. 20, 2017 for JP Pat. Appl. No. 2014508370; 1 page.
Revised Claims for Appeal dated Feb. 7, 2017 for JP Pat. Appl. No. 2014-508370; 6 pages.
Response to Office Action dated Dec. 2, 2016 and filed on Feb. 27, 2017 for U.S. Appl. No. 14/264,522; 12 pages.

\* cited by examiner

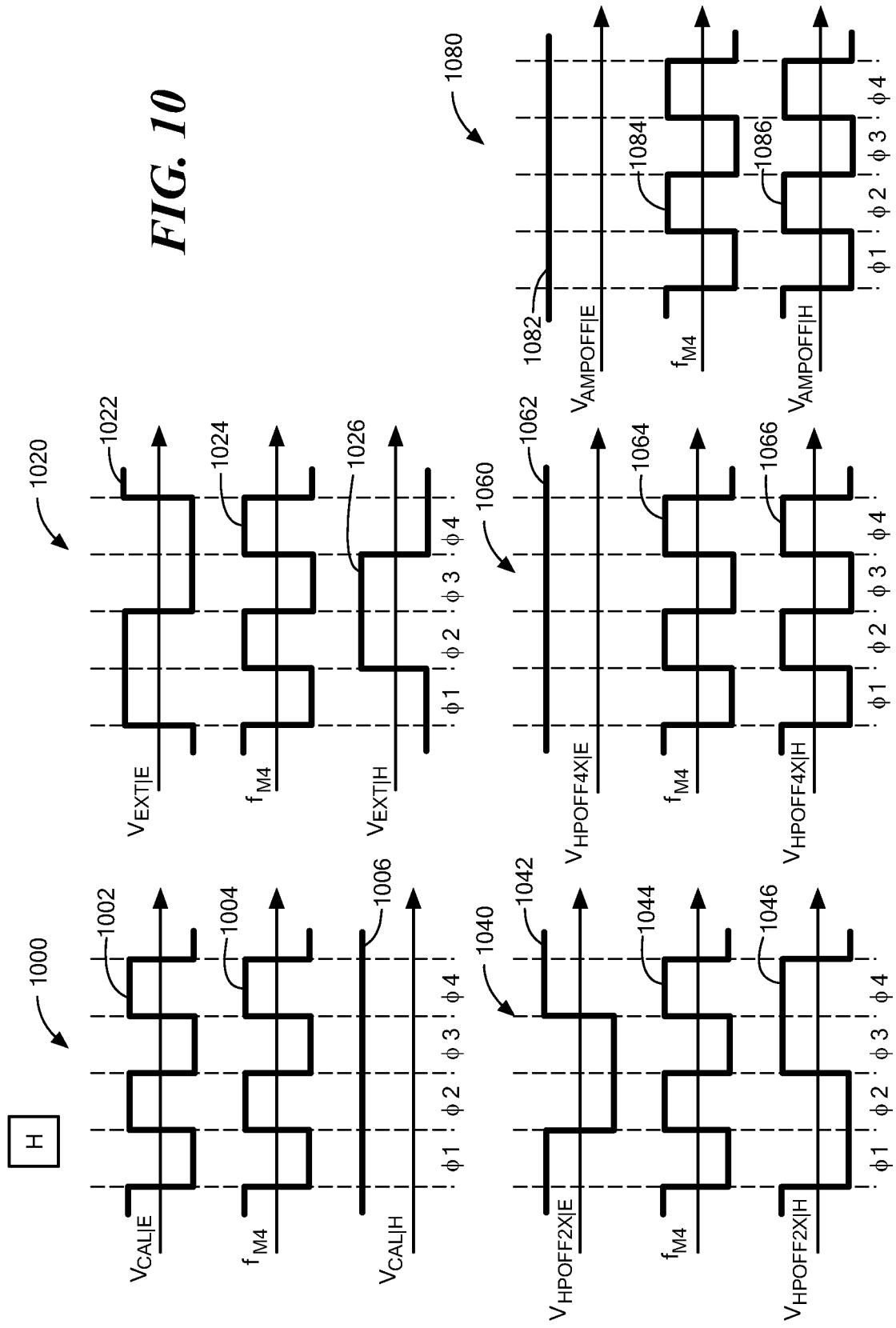

CIRCUITS AND METHODS FOR SELF-CALIBRATING OR SELF-TESTING A MAGNETIC FIELD SENSOR USING PHASE DISCRIMINATION

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to magnetic field sensors that can generate self-test of a self-calibration signal.

BACKGROUND

As is known, there are a variety of types of magnetic field sensing elements, including, but not limited to, Hall effect elements, magnetoresistance elements, and magnetotransistors. As is also known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Particular magnetic field sensor arrangements are used as examples herein. However, the circuits and techniques described herein apply also to any magnetic field sensor.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal.

Conventional built-in self-test circuits used in magnetic field sensors tend not to test the magnetic field sensing element used in the magnetic field sensor. Conventional built-in self-test circuits also tend not to test all of the circuits with a magnetic field sensor.

Some magnetic field sensors employ self-calibration techniques, for example, by locally generating a calibration magnetic field with a coil or the like, measuring a signal resulting from the calibration magnetic field, and feeding back a signal related to the resulting signal to control a gain of the magnetic field sensor. Several self-calibration arrangements are shown and described in U.S. Pat. No. 7,923,996, entitled "Magnetic Field Sensor With Automatic Sensitivity Adjustment," issued 26, 2008, and assigned to the assignee of the present invention. Also U.S. patent application Ser. No. 12/840,324, entitled "Circuits and Methods For Generating A Diagnostic Mode Of Operation In A Magnetic Field Sensor," filed Jul. 21, 2010, U.S. patent application Ser. No. 12/706,318, entitled "Circuits and Methods for Generating a Self-Test of a Magnetic Field Sensor," filed Feb. 16, 2010, and U.S. patent application Ser. No. 13/095,371, entitled "Circuits and Methods for Self-Testing or Self-Calibrating a Magnetic Field Sensor," filed Apr. 27, 2011, each assigned to the assignee of the present invention, teach various arrangements of coils and conductors disposed proximate to magnetic field sensing elements and used to generate self-test magnetic fields. The above patent and applications also teach various multiplexing arrangements. These applications and patent, and all other patent applications and patents described herein, are incorporated by reference herein in their entirety.

Typically, a self-test or a self-calibration of a magnetic field sensor takes place at a single rate or during a single predetermined time period (i.e., with a single bandwidth). In some applications, this single rate, when used for self-calibration, may result in the magnetic field sensor being inaccurate for a substantial amount of time following a power up of the magnetic field sensor. However, speeding up the self-test or the self-calibration, i.e., increasing the bandwidth of the self-calibration would result in the magnetic field sensor being less accurate and having a higher output noise level.

Also typically, self-test and/or self-calibration of the magnetic field sensor must be performed when the magnetic field sensor is not sensing a sensed magnetic field, i.e., when the magnetic field sensor is not operating in its regular sensing mode in which it is sensing an external magnetic field.

It would be desirable to provide built in self-test and/or self-calibration circuits and techniques in a magnetic field sensor that allow the self-test and self-calibration functions to test and calibrate the magnetic field sensor at a fast rate (i.e., within a short time period) while not reducing resolution and while not increasing output noise level.

It would also be desirable to provide built in self-test and/or self-calibration circuits and techniques in a magnetic field sensor that allow the self-test and self-calibration to occur while the magnetic field sensor is operating in its regular sensing mode.

It would also be desirable to provide built in self-test circuits and techniques in a magnetic field sensor that allow the self-test function to test a magnetic field sensing element used within the magnetic field sensor.

It would also be desirable to provide built in self-test circuits and techniques in a magnetic field sensor that allow the self-test all of the circuits within the magnetic field sensor.

SUMMARY

The present invention provides built in self-test and/or self-calibration circuits and techniques in a magnetic field sensor that allow the self-test and self-calibration functions to test and calibrate the magnetic field sensor at a fast rate (i.e., within a short time period) while not reducing resolution and while not increasing output noise level.

The present invention also provides built in self-test and/or self-calibration circuits and techniques in a magnetic field sensor that allow the self-test and self-calibration to occur while the magnetic field sensor is operating in its regular sensing mode.

The present invention also provides built in self-test circuits and techniques in a magnetic field sensor that allow the self-test function to test a magnetic field sensing element used within the magnetic field sensor.

The present invention also provides built in self-test circuits and techniques in a magnetic field sensor that allow the self-test all of the circuits within the magnetic field sensor.

In accordance with one aspect, a magnetic field sensor includes a reference magnetic field generator. The reference magnetic field generator is configured to generate a modulated reference magnetic field modulated by a first frequency with a first phase. The magnetic field sensor also includes a magnetic field sensing circuit comprising at least one magnetic field sensing element. The magnetic field sensing circuit is configured to generate a combined output signal responsive to the modulated reference magnetic field and also responsive to an external magnetic field. The magnetic field sensor also includes a signal processing circuit coupled to receive the combined output signal. The signal processing circuit includes a first modulator. The first modulator is configured to modulate the combined signal with the same first frequency as the reference magnetic field generator but with a second different phase to generate a modulated combined signal.

In accordance with another aspect, a method used on a magnetic field sensor includes generating a modulated reference magnetic field modulated by a first frequency with a first phase. The method also includes generating, with one or more magnetic field sensing elements, a combined output signal responsive to the modulated reference magnetic field and also responsive to an external magnetic field. The method also includes modulating the combined signal with the same first frequency as the reference magnetic field generator but with a second different phase to generate a modulated combined signal.

BRIEF DESCRIPTION OF THE DRAWINGS

The foregoing features of the invention, as well as the invention itself may be more fully understood from the following detailed description of the drawings, in which:

FIG. 10 shows a set of graphs, each one of the graphs showing a respective result of a fourth multiplexing operation upon a respective signal component of FIG. 8, the results appearing at the signal point labeled H of FIG. 1.

DETAILED DESCRIPTION

Figure 1:
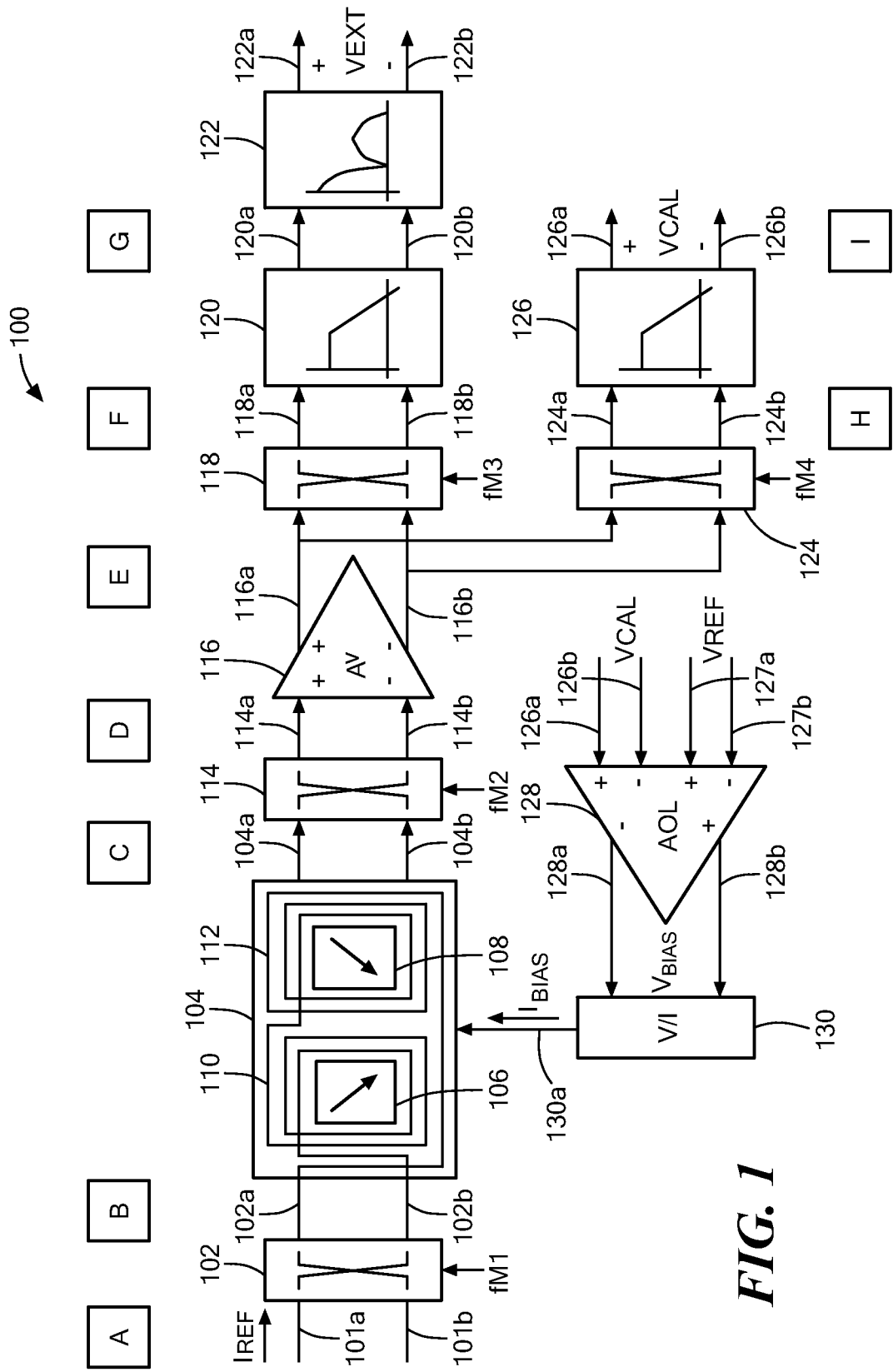
FIG. 1 is a block diagram of a magnetic field sensor having modulators arranged to provide a discrimination of an external signal component and a reference-magnetic-field-responsive signal component, the block diagram having signal points labeled A, B, C, D, E, F, G, H, and I.

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. Linear magnetic field sensors are used as examples herein. However, the circuits and techniques described herein apply also to any magnetic field sensor capable of detecting a magnetic field.

As used herein, the term "magnetic field signal" is used to describe any circuit signal that results from a magnetic field experienced by a magnetic field sensing element.

Reference-field-sensing configuration modes of operation described below are generally used to adjust a gain or a sensitivity of a magnetic field sensor. However, the reference-field-sensing configuration can also be used to provide a self-test of the magnetic field sensor. Namely, if no output signal is generated during a reference field mode of operation (or, in the case of a linear magnetic field sensor, the output signal is too low or too high), the magnetic field sensor is deemed to have failed. Thus, as used herein, the term "reference" is used to encompass sensitivity measurement (self-test) and calibration.

As used herein, the term "predetermined," when referring to a value or signal, is used to refer to a value or signal that is set, or fixed, in the factory at the time of manufacture. As used herein, the term "determined," when referring to a value or signal, is used to refer to a value or signal that is identified by a circuit during operation, after manufacture.

As used herein, the term "external magnetic field" refers to a magnetic field that is generated external to a magnetic field sensor, but which the magnetic field sensor experiences, and which it is intended that the magnetic field sensor will measure and provide an output signal responsive thereto for the purposes of measuring the external magnetic field in the environment.

As used herein, the term "reference magnetic field" or "calibration magnetic field" refers to a predetermined magnetic field that is generated internal to or adjacent to a magnetic field sensor, and which the magnetic field sensor experiences, and which it is intended that the magnetic field sensor will measure and provide an output signal responsive thereto for the purposes of self-test of self-calibration.

The terms "current spinning" and "chopping" are used synonymously herein to describe a particular technique of using a Hall element, notably, a planar Hall element herein. In essence, during current spinning, a four terminal planar Hall element is driven with a current flowing between opposite terminals that are sequentially selected in a rotating sequence around the planar Hall element. Output signals are generated across sequentially selected non-driven output terminals. When so called four phase current spinning is applied to a four terminal planar Hall element, four combinations of driven and non-driven output terminals results. The four combinations of driven and non-driven output terminals are often referred to as phases of zero, ninety, one hundred eighty, and two hundred seventy degrees.

In operation, each selection of driven and non-driven output terminals tends to result in a different undesirable DC offset voltage in the output signal at each respective pair of output terminals. The different offset voltages tend to cancel or almost cancel, leaving a near-zero offset voltage.

While current spinning can be used to nearly cancel offset voltage from an output signal from a planar Hall element, other techniques can be used to reduce the offset voltage even further. For example, one technique uses two planar Hall elements coupled in parallel, wherein the two planar Hall elements are individually driven with current spinning phases that are ninety degrees apart. In some embodiments, sequential current spinning is not used and the two planar Hall elements each remain at a particular static current spinning phase ninety degrees from the other. However, in other embodiments, sequential current spinning is used and the two planar Hall elements are sequentially driven at different current spinning phases at different ones of their respective four terminals, and the phase of the two planar Hall elements remains ninety degrees apart for each current spinning phase.

Referring to FIG. 1, an exemplary magnetic field sensor 100 includes two planar Hall elements 106, 108. Coupling of the two planar Hall elements 106, 108 is not shown, but is described more fully below in conjunction with FIG. 2. However, let it suffice here to say that the two planar Hall elements 106, 108 can be coupled together in parallel and driven at current spinning phases that are ninety degrees apart.

A switching circuit 104, also referred to herein as a current spinning module, can provide the above-described current spinning. Current sources used to drive the two planar Hall elements 106, 108 are not shown, but are within or otherwise coupled to the switching circuit 104.

The planar Hall element 106 is disposed proximate to a current conductor 110, here shown to be a coil 110. The planar Hall element 108 is disposed proximate to a current conductor 112, here shown to be a coil 112. The two coils 110, 112 can be coupled in series.

A switching modulator 102 can be coupled to receive it current signal 101a, 101b at input nodes thereof. The switching modulator 102 can be configured to generate a switched signal 102a, 102b at output nodes thereof. Output nodes of the switching modulator 102 can be coupled to the two coils 110, 112.

The switching modulator 102 can be coupled to receive a clock signal, fM1, that causes the switching circuit 102 to sequentially alternate signal paths such that it some times the current signal 101a and the signal 102a are the same and the signal 101b and the signal 102b are the same, and, at other times, the current signal 101a and the signal 102b are the same and the signal 101b and the signal 102a are the same. Thus, the current signals 102a, 102b are AC current signals. The AC current signals 102a, 102b can be coupled to coils 110, 112.

It should be understood that the planar Hall element 106 is responsive to an AC magnetic field generated by the coil 110 and also responsive to an external magnetic field experienced by the magnetic field sensor 100. Similarly, the planar Hall element 108 is responsive to an AC magnetic field generated by the coil 112 and also responsive to the external magnetic field experienced by the magnetic field sensor 100.

The two planar Hall elements 106, 108 are configured to generate, via the switching circuit 104, a differential output signal 104a, 104b as a sequential signal in four current spinning phases. From the above discussion, it should be understood that the differential output signal 104a, 104b is comprised of a sum of two components, an external signal portion responsive to the external magnetic field, and a reference-magnetic-field-responsive signal portion responsive to magnetic fields generated by the coils 106, 108.

A switching modulator 114 is coupled to receive the differential signal 104a, 104b and configured to generate a differential switched signal 114a, 114b. The switching modulator 114 can be coupled to receive a clock signal, fM2, that causes the switching modulator 114 to sequentially alternate signal paths in a way the same as or similar to that which is described above in conjunction with the switching modulator 102.

An amplifier 116 is coupled to receive the differential switched signal 114a, 114b and configured to generate a differential amplified signal 116a, 116b.

In an external magnetic field signal channel, a switching modulator 118 is coupled to receive the differential amplified signal 116a, 116b and configured to generate a differential switched signal 118a, 118b. The switching modulator 118 can also be coupled to receive a switching clock signal, fM3, that causes the switching modulator 118 to sequentially alternate signal paths in a way the same as or similar to that which is described above in conjunction with the switching modulator 102. A low pass filter 120 can be coupled to receive the differential switched signal 118a, 118b and configured to generate a differential filtered signal 120a, 120b. A notch filter 122 can be coupled to receive the filtered signal 120a, 120b and configured to generate a differential notch filtered signal 122a, 122b, also referred to herein as an external-magnetic-field signal, VEXT. In some other embodiments, there is no notch filter 122.

In some embodiments, the notch filter 122 is a digital filter preceded by and analog-to-digital converter (not shown). In other embodiments, the notch filter 122 is a sampled analog filter, for example, a switched capacitor notch filter. An exemplary switched capacitor notch filter that can form the notch filter 122 is described in U.S. Pat. No. 7,990,209, issued on Aug. 2, 2011, which application is incorporated by reference herein in its entirety. With either a digital filter or a sampled analog filter it will be understood that frequencies of filter notches can be elected by selection of a sampling frequency. Advantageous selections are described below in conjunction with FIG. 9.

In a reference magnetic field signal channel, a switching modulator 124 is coupled to receive the differential amplified signal 116a, 116b and configured to generate a differential switched signal 124a, 124b. The switching modulator 124 can also be coupled to receive a switching clock signal, fM4, that causes the switching modulator 124 to sequentially alternate signal paths in a way the same as or similar to that which is described above in conjunction with the switching modulator 102. A low pass filter 126 can be coupled to receive the differential switched signal 124a, 124b and configured to generate a differential filtered signal 126a, 126b, also referred to herein as a calibration-magnetic-field signal, VCAL.

In some embodiments, the clock signals, fM1, fM2, and fM3 all have the same frequency, but fM1 and fM2 have different phases.

In some embodiments, in a feedback channel, the magnetic field sensor 100 can also include an error amplifier 128 coupled to receive the calibration-magnetic-field signal 126a, 126b and coupled to receive a predetermined DC reference signal 127a, 127b, and configured to generate a differential amplified error signal 128a, 128b. A voltage to current converter 130 can be coupled to receive the differential amplified error signal 128a, 128b and configured to generate a bias current signal 130a. The bias current signal 130a can be received by the switching circuit 104, and therefore, by the two planar Hall elements 106, 108 to drive or adjust a magnitude of a drive current that drives the two planar Hall elements 106, 108.

In operation, it will be appreciated that the feedback channel having the error amplifier 128 can adjust a sensitivity of the two planar Hall elements 106, 108 to achieve a calibrated sensitivity of the magnetic field sensor 100.

In other embodiments, the differential error voltage signal 128a, 128b can instead be coupled to the amplifier 116 and, in operation, can adjust a gain of the amplifier 116 to achieve a calibrated sensitivity of the magnetic field sensor 100.

It will also be recognized that the differential signal 126a, 126b is indicative of a self-test of the magnetic field sensor 100. Thus, for embodiments that do not include the feedback channel having the error amplifier 128, still the differential signal 126a, 126b can provide an indication of the self-test of the magnetic field sensor 100.

While various signals are shown and described to be differential signal, in other embodiments, selected signals can be single ended signals.

In operation, it will become apparent from discussion below that the external-magnetic-field signal 122a, 122b, VEXT, is responsive to an external magnetic field and not responsive to the calibration magnetic field generated by the coils 110, 112. Similarly, the calibration-magnetic-field signal 126a, 126b, VCAL, is responsive to the calibration magnetic field generated by the coils 110, 112, and not responsive to the external magnetic field. With this arrangement, it should be apparent that the self-test represented by the calibration-magnetic-field signal 126a, 126b, VCAL, is available even when the magnetic field sensor is sensing or experiencing an external magnetic field and the external-magnetic-field signal, VEXT, is available even when the magnetic field sensor 100 is performing self-test, or being calibrated by way of the feedback channel having the error amplifier 128.

In other embodiments, the modulated current signal 102a, 102b can instead be generated by an oscillator followed by a current driver circuit, in which case, the modulator 102 is not required. In these embodiments, the oscillator has the frequency, fM1.

In other embodiments, the coils 110, 112 can instead be current conductors around which magnetic fields are generated.

Figure 2:
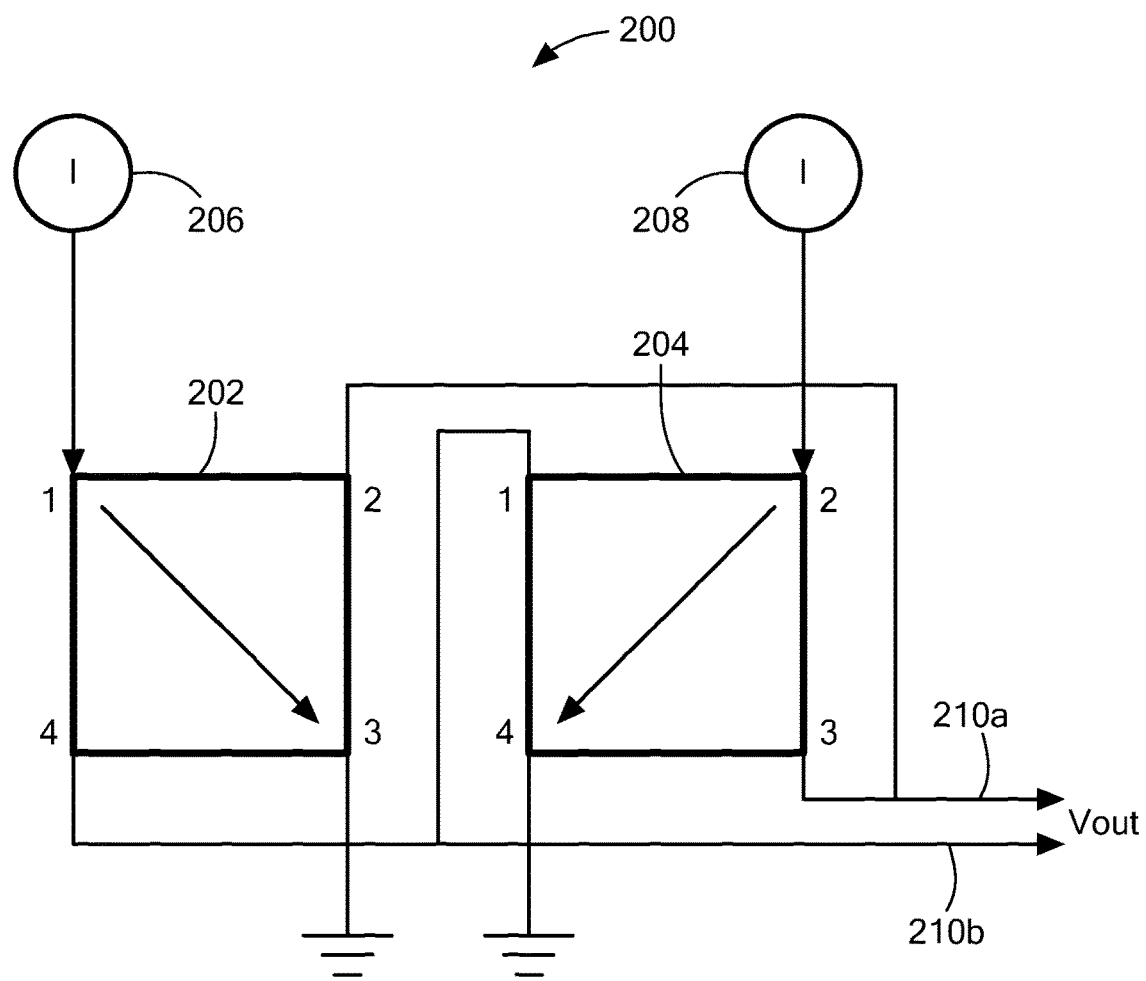
FIG. 2 is a block diagram showing to planar Hall elements coupled in parallel.

Referring now to FIG. 2, a first planar Hall element 202 is coupled to a second planar Hall element 204. The two planar Hall elements 202, 204 have corners, i.e. terminals, numbered 1, 2, 3, and 4.

A first current source 206 is coupled to terminal number 1 of the planar Hall element 202. A second current source 208 is coupled to terminal number 2 of the planar Hall element 204. Terminal number 3 of the planar Hall element 202 and terminal number 4 of the planar Hall element 204 are both grounded, or otherwise coupled to a reference voltage. Drive current flows between terminals 1 and 3 of the planar Hall element 202. Drive current flows between terminals 2 and 4 of the planar Hall element 204. With this arrangement, and with reference to fork coupling phases used in current spinning, the planar Hall element 202 is coupled in a zero degree phase arrangement, and the planar Hall element 204 is coupled in a ninety degree phase arrangement.

Output terminals numbered 2 and 4 of the planar Hall element 202 are coupled to output terminals numbered 3 and 1, respectively, of the planar Hall element 204. The two planar Hall elements 202, 204 generate a differential output signal 210a, 210b.

But shown in the static coupling arrangement, for embodiments that use current spinning, both of the couplings of the two planar Hall elements can be sequentially rotated or spun during current spinning.

Keeping the couplings of the two planar Hall elements 202, 204 always ninety degrees apart results in a lower offset voltage in the differential output signal 210a, 210b.

Graphs shown below in conjunction with FIGS. 3-10 all have horizontal axes with units of time in arbitrary units and vertical axes with units of amplitude in arbitrary units of volts. Thus, all of the graphs shown below are time domain graphs.

Figure 3:
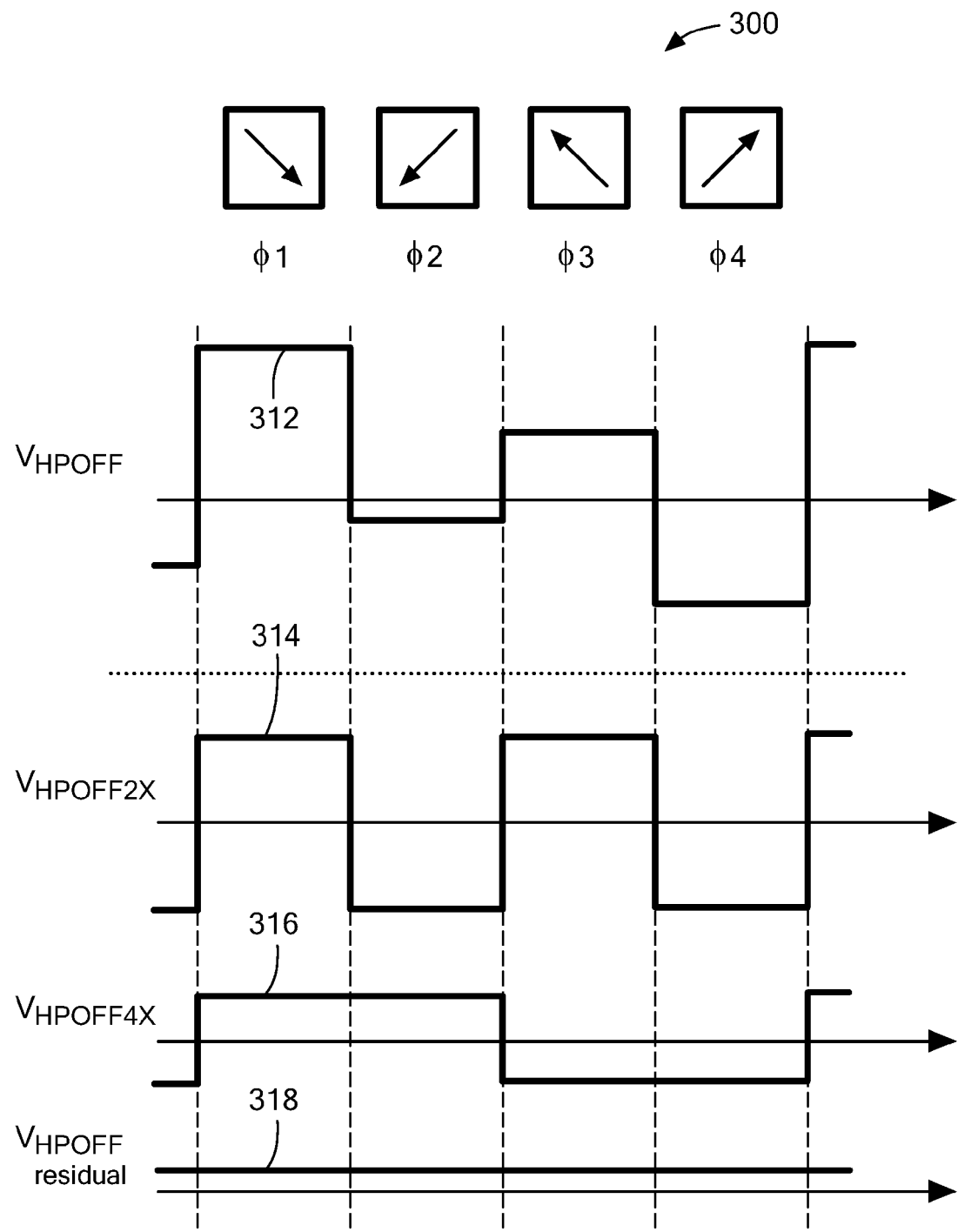
FIG. 3 is a graph showing a generalized signal generated by a planar Hall element during four phase current spinning and showing components of the signal separately, the separate components referred to herein as "current spinning offset signal components;"

Referring now to FIG. 3, a pictorial 300 is representative of the four current spinning phases, zero, ninety, one hundred eighty, and two hundred seventy degrees that can be generated, for example, by the switching circuit 104 of FIG. 1.

A graph 310 shows a signal 312 that is representative of amplitudes of a differential output signal, for example, the differential output signal 210a, 210b of FIG. 2, for the four rotational phases of current spinning Each different amplitude step of the signal 312 is associated with a respective one of the phases of the current spinning Thus, each one of the phases of the current spinning can result in a different offset voltage.

For purposes of signals shown in graphs below, the signal 312 can be broken into different parts or current spinning signal components that together, when summed, form the signal 312. There is no component of the signal 312 that is responsive to an external magnetic field. Instead, only offset voltage characteristics are shown.

A signal current spinning offset signal component 314, VHPOFF2X, a current spinning offset signal component 316, VHPOFF4X, and a residual current spinning offset signal component 318, VHPOFFresidual, when summed together, form the signal 312.

It should be noted that the three current spinning signal components 314, 316, 318 above occur at different frequencies. If there is a current spinning frequency, Fspin, at which the planar Hall elements 202, 204 of FIG. 2 are sequentially switched in drive current direction, then the frequency of the current spinning offset signal component 314 is Fspin, the frequency of the current spinning offset signal component 316 is Fspin/2, and the frequency of the residual current spinning offset signal component 318 is zero or DC.

FIGS. 4-10 below are representative of signals associated with the magnetic field sensor 100 of FIG. 1 at different ones of the points labeled A, B, C, D, E, F, and H. Most of the above described current spinning offset signal components are separately shown in FIGS. 4-10 for clarity. However, the residual current spinning offset signal component 318 is not shown and it is assumed to have a value at or near zero. Some comments are made below about a residual current spinning offset signal component should one occur.

Though current spinning offset signal component are shown in FIGS. 4-10, in other embodiments, there is no current spinning and the two planar Hall elements 106, 108 of FIG. 1 are driven in fixed and predetermined drive arrangements. For the fixed and predetermined arrangements, current spinning offset signal components shown below in FIGS. 4-10 are not present. However, for the fixed and predetermined arrangements there can be a DC offset comparable to, but larger than, the residual current spinning offset signal component 318 of FIG. 3.

As described above, in some embodiments, even for the fixed and predetermined drive arrangements, the two planar Hall elements 108, 112 can be driven in static current spinning phases that are ninety degrees apart. However, in still other embodiments, the two planar Hall elements 106, 108 can be driven with the same current spinning phase. In still other embodiments, there is only one planar Hall element and one associated coil, and current spinning may or may not be used.

In still other embodiments, the planar Hall elements 106, 108 are replaced by another form of magnetic field sensing elements, for example, vertical Hall elements or magnetoresistance elements. In embodiments that use vertical Hall elements, current spinning may or may not be used and other statements about current spinning phases made above also apply to the vertical hall elements. In embodiments that use magnetoresistance elements, current spinning is not available.

Figure 4:
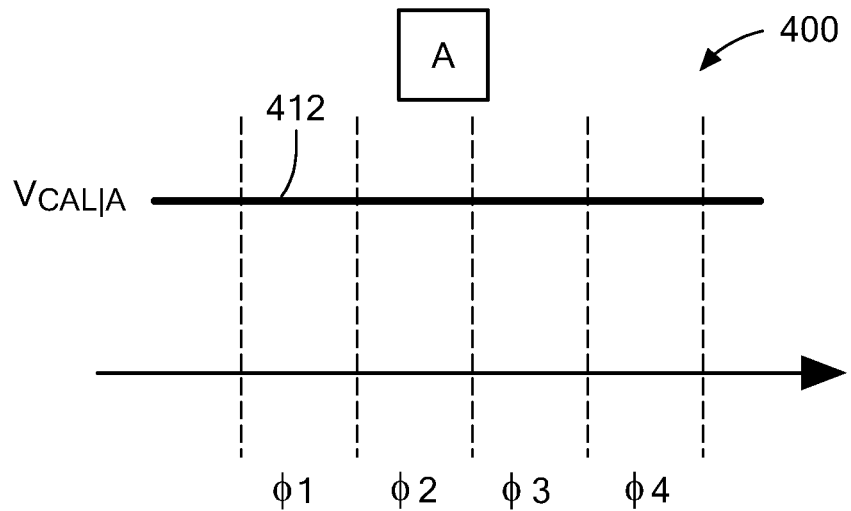
FIG. 4 is a graph showing a signal at the signal point labeled A of FIG. 1.

Referring now to FIG. 4 a signal 412 is representative of a DC voltage resulting from a DC current at point A of FIG. 1.

Figure 5:
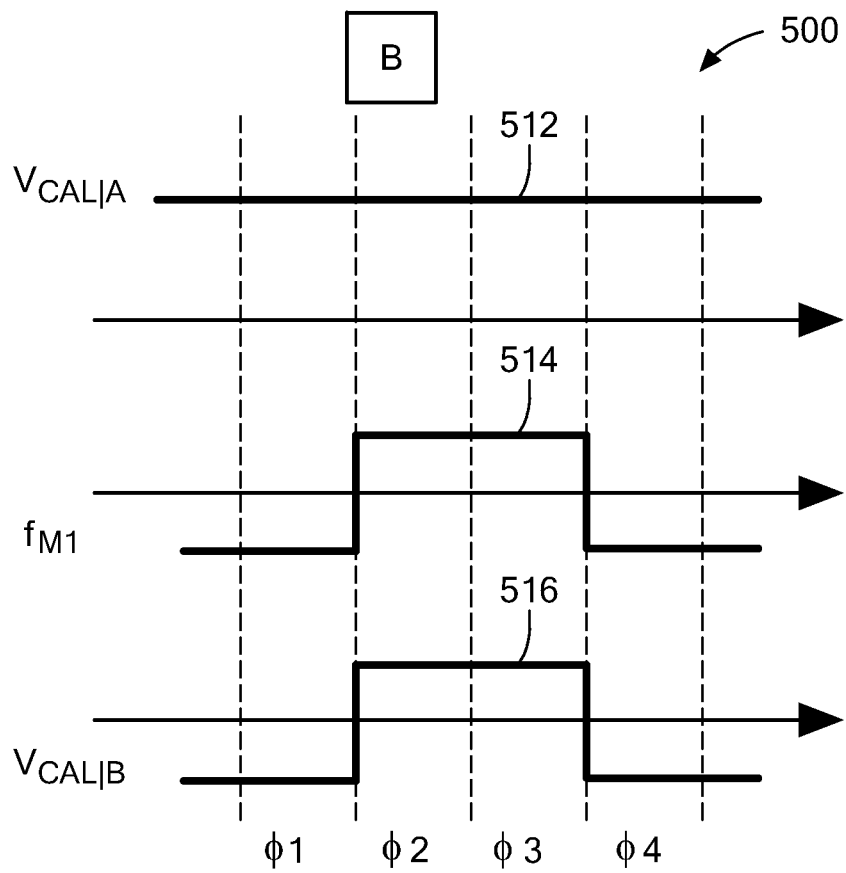
FIG. 5 is a graph showing the signal at the signal point labeled A of FIG. 1, showing a multiplexing clock signal, and showing a signal at the signal point labeled B of FIG. 1 that results from a first multiplexing operation.

Referring now to FIG. 5, a signal 512 is the same as the signal 412 of FIG. 4.

A clock signal 514 is representative of the clock signal fM1 of FIG. 1. The clock signal fM1 has a frequency one half that of the current spinning frequency, or Fspin/2. The clock signal 514 has a particular phase, with a rising edge on the beginning of the second current spinning phase, Φ2. The clock signal 514 can also have a fifty percent duty cycle.

A signal 516 is representative of a signal at point B of FIG. 1. The signal 516 is representative of a voltage appearing on the series coupled coils 110, 112. Two calibration (or reference) magnetic fields are generated by the coils 110, 112, accordingly.

Figure 6:
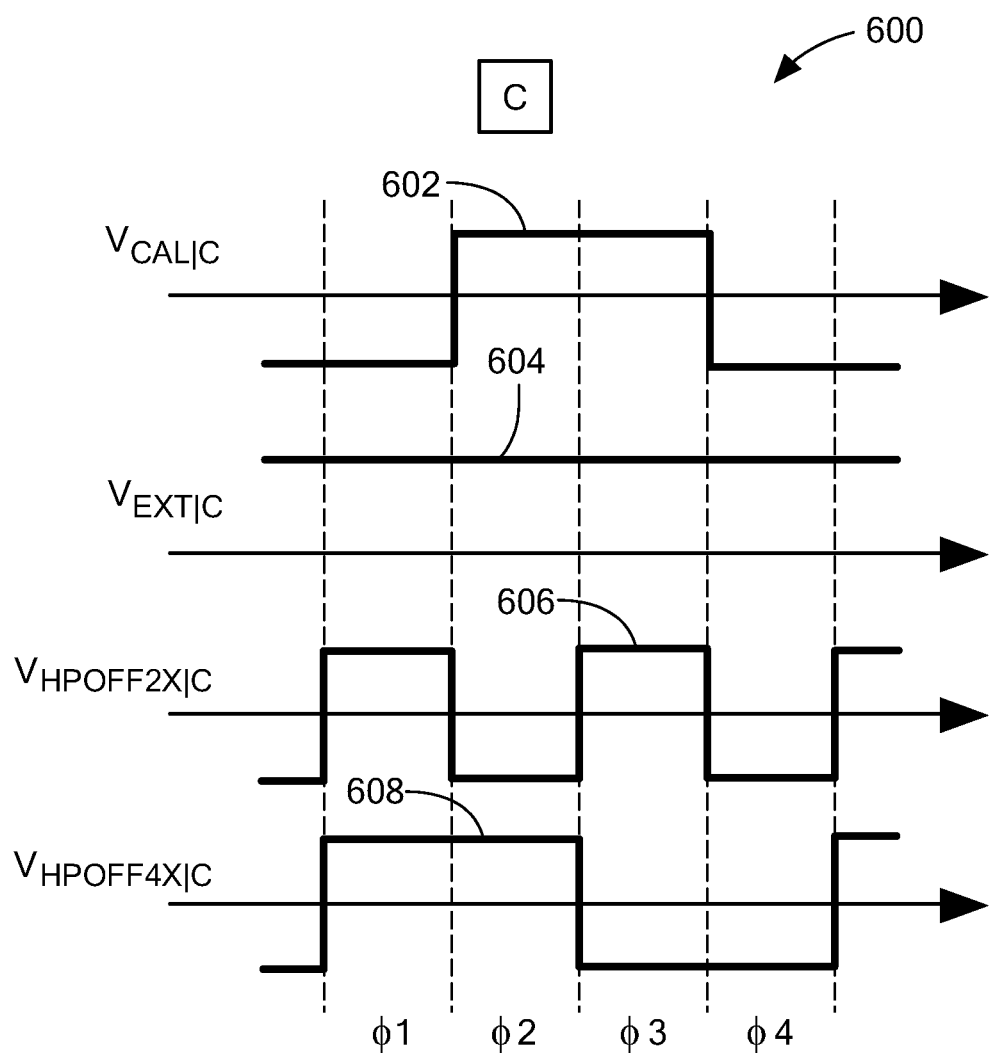
FIG. 6 is a graph separately showing a reference-magnetic-field-responsive signal portion and a measured-magnetic-field-responsive signal portion at the signal point labeled C of FIG. 1, and also separately showing current spinning components.

Referring now to FIG. 6, a signal component 602 is representative of a reference-magnetic-field-responsive signal component of a composite signal at point C of FIG. 1. The magnetic-field-responsive signal component 602 is responsive to the magnetic field generated by the coils 110, 112 of FIG. 1, and is not responsive to an external magnetic field generated outside of the magnetic field sensor 100.

A signal component 604 is representative of an external magnetic field signal component of the composite signal at point C of FIG. 1. The external signal component 604 is responsive to an external magnetic field generated outside of the magnetic field sensor 100, and is not responsive to the magnetic field generated by the coils 110, 112 of FIG. 1. The external magnetic field signal component 604 is shown as a DC signal merely for clarity in FIG. 6 and in figures below. However, the external magnetic field component can be an AC signal, either a linear signal, e.g., a sinusoid, or a non-linear signal, e.g., a step function. However, as depicted in FIG. 6, if the magnetic field signal component 604 has an AC signal component, the AC signal component would be slowly varying with respect to a frequency of the current spinning, and thus, the magnetic field signal component 604 would appear to be non-varying on the time scale shown.

Current spinning offset signal components 606, 608 are representative of an offset voltage generated by the planar Hall elements 106, 108 of FIG. 1 during current spinning, and are the same as or similar to the current spinning offset signal components 314, 316 of FIG. 3. As described above, for clarity, it is assumed that a residual current spinning offset signal component comparable to the residual current spinning offset signal component 318 of FIG. 3 is at or near zero.

It will be understood that, if a residual current spinning offset signal component comparable to the residual current spinning offset signal component 318 of FIG. 3 were present, at the point C of FIG. 1, the residual current spinning offset signal component will appear as a DC signal, and thus, it will essentially add to the external magnetic field signal component 604, which is also at DC, and will be inseparable from the magnetic field signal component 604 in FIG. 6 and in all figures below. The same holds true for embodiments that do not use current spinning and for which the planar Hall elements 106, 108 of FIG. 1 tend to generate a DC offset voltage (which may be larger than a residual current spinning offset signal component) at the point C of FIG. 1. Thus, current spinning is desirable to reduce and DC offset voltage at the point C of FIG. 1.

In FIGS. 7-10 below, the four signal components 602, 604, 606, 608 are treated separately, and results of the various modulators of FIG. 1 are shown separately for the separate components. However, it will be recognized that the four signal components 602, 604, 606, 608 of FIG. 6 exist simultaneously and sum together at the circuit point labeled C in FIG. 1. Similarly, separate signal components of FIGS. 7-10 exists simultaneously and sum together to form a composite signal at the indicated points of FIG. 1. Furthermore, as described above, the external magnetic field signal component, e.g., 604, is shown to be a DC signal for clarity, but could otherwise be an AC signal having a signal bandwidth.

In FIGS. 7-10 below, it should be recognized that reference-magnetic-field-responsive signal components described below are each responsive to a reference magnetic field, for example, reference magnetic fields generated by the coils 110, 112 of FIG. 1, and not responsive to an external magnetic field generated outside of a magnetic field sensor, e.g., outside of the magnetic field sensor 100 of FIG. 1, but experienced by the magnetic field sensor 100. Similarly, it should be understood that external magnetic field signal components described below are each responsive to an external magnetic field generated outside of a magnetic field sensor, e.g., outside of the magnetic field sensor 100 of FIG. 1, but experienced by the magnetic field sensor, and not responsive to a reference magnetic field, for example, reference magnetic fields generated by the coils 110, 112 of FIG. 1.

Figure 7:
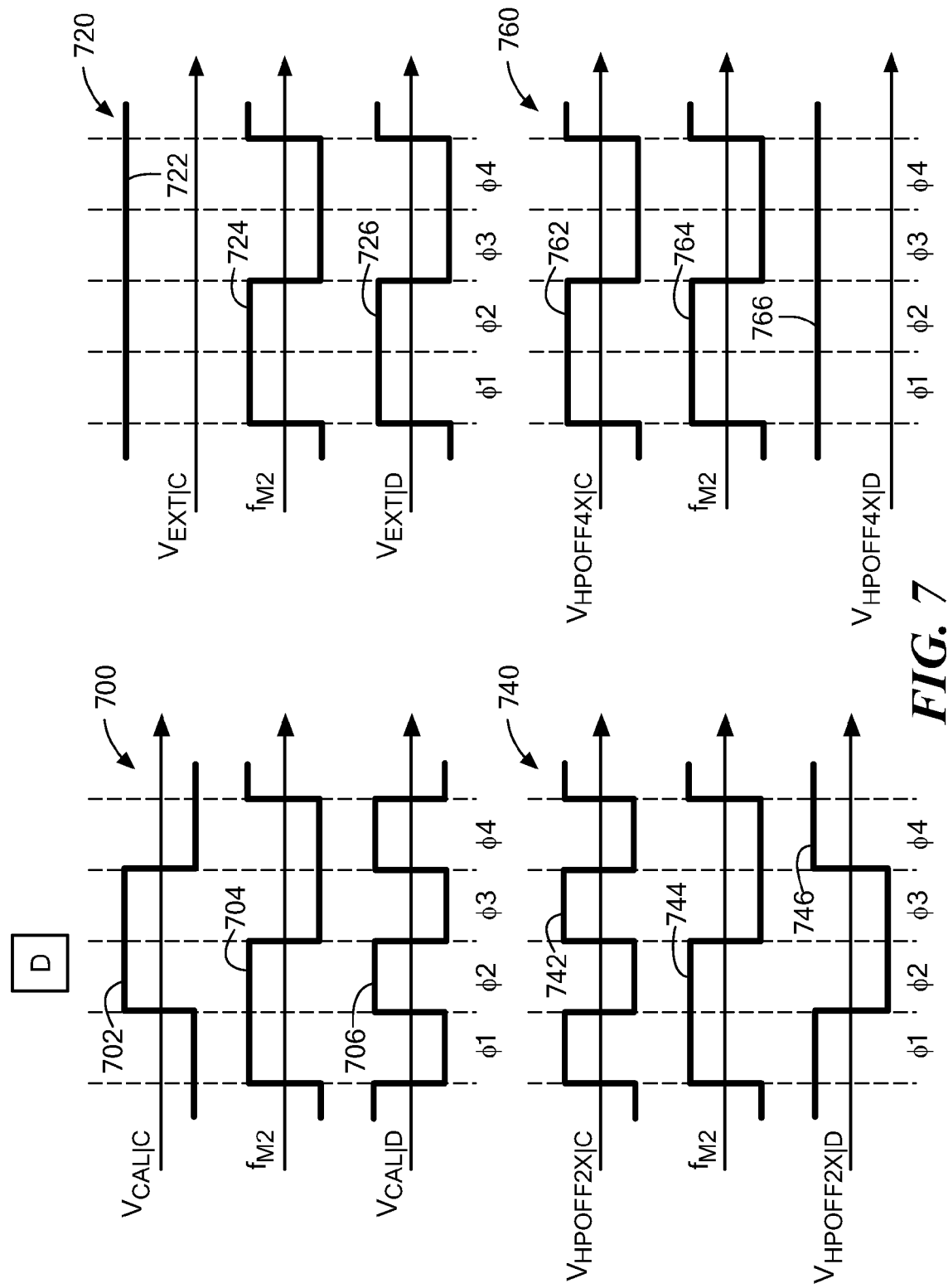
FIG. 7 is a set of graphs, each one of the graphs showing a respective result of a second multiplexing operation upon a respective signal component of FIG. 6, the results appearing at the signal point labeled D of FIG. 1.

Referring now to FIG. 7, in a first graph 700, a signal component 702 is the same as or similar to the signal component 602 of FIG. 6, and is representative of a reference-magnetic-field-responsive signal component of a composite signal at point C of FIG. 1.

In a second graph 720, a signal component 722 is the same as or similar to the signal components 604 of FIG. 6, and is representative of an external magnetic field signal component of the composite signal at point C of FIG. 1.

In a third graph 740, a signal components 742 is the same as or similar to the signal component 606 of FIG. 6, and is of representative of one current spinning offset signal component of the composite signal at point C of FIG. 1 (see, e.g., offset signal component 314 of FIG. 3).

In a fourth graph 760, a signal component 762 is the same as or similar to the signal component 608 of FIG. 6, and is of representative of another current spinning offset signal component of the composite signal at point C of FIG. 1 (see, e.g., offset signal component 316 of FIG. 3).

A clock signal, shown in four instances 704, 724, 744, 764, is representative of the clock signal, fM2, of FIG. 1. Like the clock signal, fM1, described above in conjunction with FIG. 5, the clock signal, fM2, has the same frequency, Fspin/2. However the clock signal, fM2 is phase shifted by ninety degrees from the clock signal, fM1. In one particular embodiment, the clock signal, fM2, has a rising edge on the start of the first current spinning phase Φ1. The clock signal, fM2, can have fifty percent duty cycle.

It will become apparent from discussion below that the ninety degree phase difference between clocks fM1 and fM2 contributes to an ability to separate signal components in separate signal channels.

In the first graph 700, a signal component 706 is representative of operation of the switching modulator 114 of FIG. 1 upon the signal component 702, resulting in the reference-magnetic-field signal component 706 at the point labeled D of FIG. 1.

In the second graph 720, a signal component 726 is representative of operation of the switching modulator 114 of FIG. 1 upon the signal component 722, resulting in the external magnetic field signal component 726 at the point labeled D of FIG. 1.

In the third graph 740, a signal component 746 is representative of operation of the switching modulator 114 of FIG. 1 upon the signal component 742, resulting in the current spinning offset signal component 746 at the point labeled D of FIG. 1.

In the fourth graph 760, a signal component 766 is representative of operation of the switching modulator 114 of FIG. 1 upon the signal component 762, resulting in the current spinning offset signal component 766 at the point labeled D of FIG. 1.

The signal components 706, 726, 746, 766 combine together to form a composite signal at the point D of FIG. 1. From discussion below in conjunction with FIGS. 9 and 10, it will be apparent that signal components can be separated by techniques described herein.

In FIG. 7, a residual signal component comparable to the residual signal component 318 of FIG. 3 is not shown. However, it will be understood that such a residual signal component can exist at the point C of FIG. 1 and will add to the signal component 722, which is undesirable, and which would result in a slightly different magnitude signal component 726.

Figure 8:
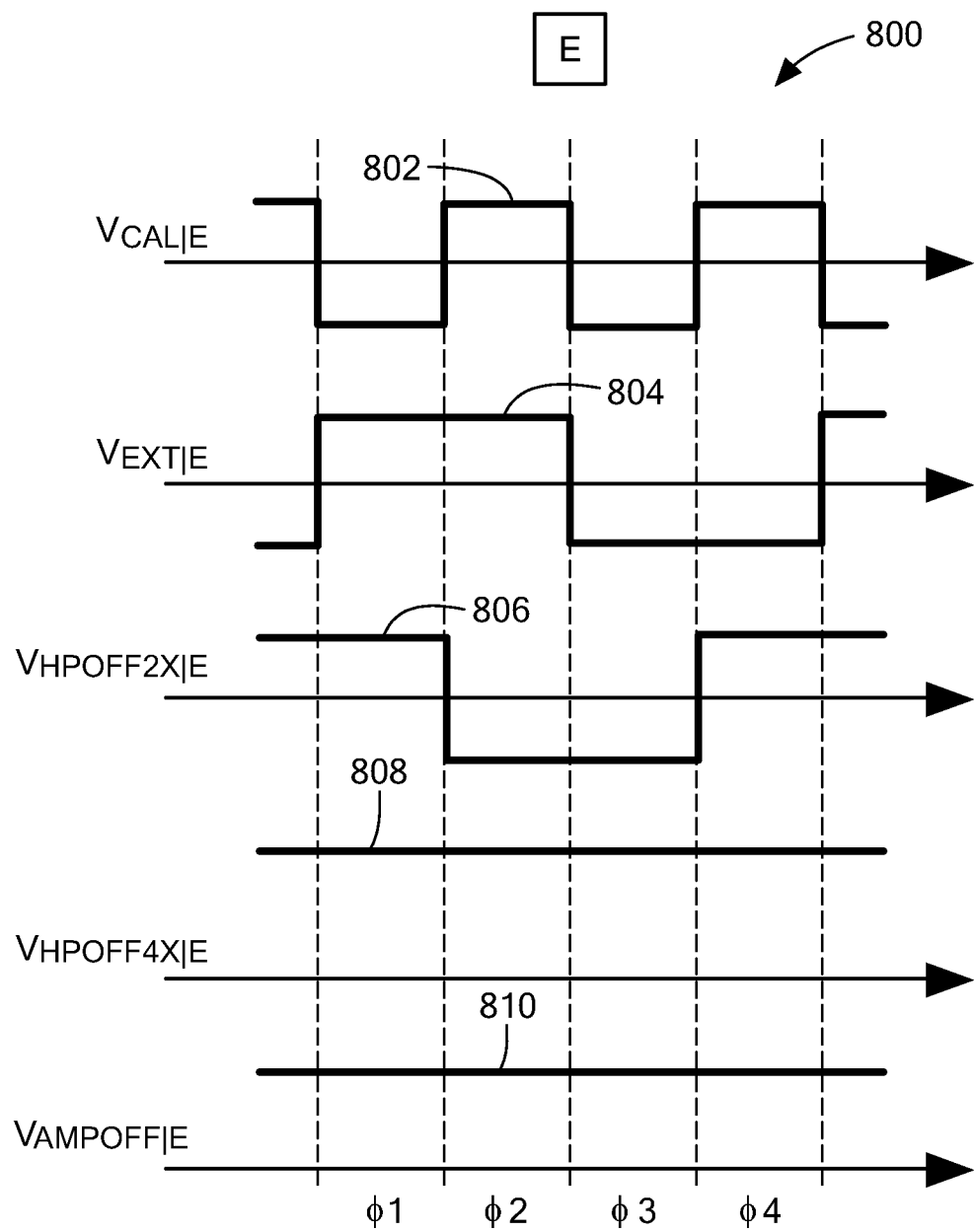
FIG. 8 is a graph showing a set of graphs, each one of the graphs showing a respective signal component at the signal point labeled E of FIG. 1.

Referring now to FIG. 8, signals components are shown at the point E of FIG. 1, and thus, have the same characteristics (other than amplitude) as the signal components at the point D of FIG. 1 (i.e., signal components 706, 726, 746, 766 of FIG. 7), as they have merely passed through the linear amplifier 116.

A reference-magnetic-field signal component 802 is the same as or similar to the reference-magnetic-field signal component 706 of FIG. 7. An external magnetic field signal component 804 is the same as or similar to the external magnetic field signal component 726 of FIG. 7. A current spinning offset signal component 806 is the same as or similar to the current spinning offset signal component 746 of FIG. 7. A current spinning offset signal component 808 is the same as or similar to the current spinning offset signal component 766 of FIG. 7. Each signal components 802-810 may be amplified compared to the comparable signal components of FIG. 7.

Also shown, a signal component 810 can result from a DC offset voltage generated by the amplifier 116 of FIG. 1.

All or the signal components 802-810 can sum together to form a composite signal at the point E of FIG. 1.

Figure 9:
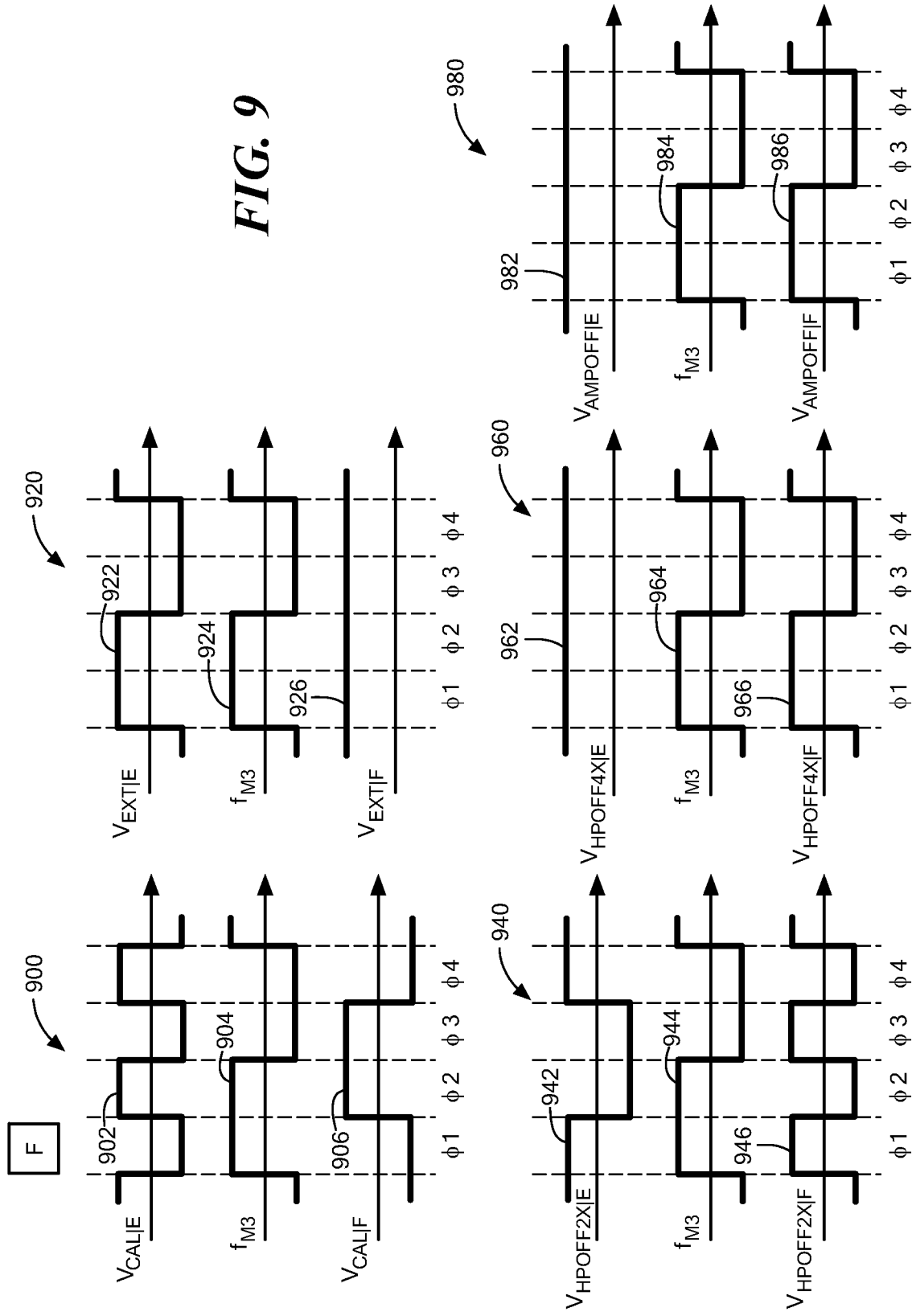
FIG. 9 is a graph showing a set of graphs, each one of the graphs showing a respective result of a third multiplexing operation upon a respective signal component of FIG. 8, the results appearing at the signal point labeled F of FIG. 1.

Referring now to FIG. 9, the five signal components of FIG. 8, which exist at the point E of FIG. 1, are separately treated in the signal channel having the points F and G of FIG. 1.

In a first graph 900, a reference-magnetic-field signal component 902 is the same as or similar to the reference-magnetic-field signal component 802 of FIG. 8, and is representative of a reference-magnetic-field-responsive signal component of a composite signal at point E of FIG. 1.

In a second graph 920, an external magnetic field signal component 922 is the same as or similar to the external magnetic field signal components 804 of FIG. 8, and is representative of an external magnetic field signal component of the composite signal at point E of FIG. 1.

In a third graph 940, a current spinning offset signal component 942 is the same as or similar to the current spinning offset signal component 806 of FIG. 8, and is of representative of one offset voltage component of the composite signal at point E of FIG. 1 (see, e.g., offset signal component 314 of FIG. 3).

In a fourth graph 960, a current spinning offset signal component 962 is the same as or similar to the current spinning offset signal component 808 of FIG. 8, and is of representative of another offset voltage component of the composite signal at point E of FIG. 1 (see, e.g., offset signal component 316 of FIG. 3).

In a fifth graph 980, and amplifier offset signal component 982 is the same as or similar to the amplifier offset signal component 810 of FIG. 8, and is of representative of an amplifier offset voltage component of the composite signal at point E of FIG. 1.

A clock signal, shown in five instances 904, 924, 944, 964, is representative of the clock signal, fM3, of FIG. 1. Like the clock signals, fM1, fM2, described above in conjunction with FIGS. 5 and 7, the clock signal, fM3, has the same frequency, Fspin/2. However the clock signal, fM3, is phase shifted by ninety degrees from the clock signal, fM1, and is at the same phase as the clock signal, fM2. In one particular embodiment, the clock signal, fM2, has a rising edge on the start of the first current spinning phase Φ1. The clock signal, fM2, can have fifty percent duty cycle.

In the first graph 900, a reference-magnetic-field signal component 906 is representative of operation of the switching modulator 118 of FIG. 1 upon the reference-magnetic-field signal component 902, resulting in the reference-magnetic-field signal component 906 at the point labeled F of FIG. 1.

In the second graph 920, an external magnetic field signal component 926 is representative of operation of the switching modulator 118 of FIG. 1 upon the external magnetic field signal component 922, resulting in the external magnetic field signal component 926 at the point labeled F of FIG. 1.

In the third graph 940, a current spinning offset signal component 946 is representative of operation of the switching modulator 118 of FIG. 1 upon the current spinning offset signal component 942, resulting in the current spinning offset signal component 946 at the point labeled F of FIG. 1.

In the fourth graph 960, a current spinning offset signal component 966 is representative of operation of the switching modulator 118 of FIG. 1 upon the current spinning offset signal component 962, resulting in the current spinning offset signal component 966 at the point labeled F of FIG. 1.

In the fifth graph 980, an amplifier offset signal component 986 is representative of operation of the switching modulator 118 of FIG. 1 upon the amplifier offset signal component 982, resulting in the amplifier offset signal component 986 at the point labeled F of FIG. 1.

The signal components 906, 926, 946, 966, 986 combine together to form a composite signal at the point F of FIG. 1.

In FIG. 9, a residual signal component comparable to the residual signal component 318 of FIG. 3 is not shown. However, it will be understood that such a residual signal component can exist at the point F of FIG. 1 and can affect a magnitude of the external magnetic field signal component 926.

By inspection of the signal components 906, 926, 946, 966, 986 it will be observed that only the external magnetic field signal component 926 is at DC (or at baseband), while the other signal components are at a higher frequency. The external magnetic field signal component 926 is the only external magnetic field signal component. It will be understood that operation of the low pass filter 120 of FIG. 1 can result in substantially only the external magnetic field signal component 926 being present at the point G of FIG. 1. Further operation of the notch filter 122 can result in further reduction of other signal components, including current spinning offset signal component 946, 966, including the amplifier offset signal component 986 and including the reference-magnetic-field signal component 906 that is responsive to the magnetic field generated by the coils 110, 112 of FIG. 1.

By further inspection of the other signal components 906, 946, 966, 986, it can be seen that the other signal components have frequencies of either Fspin/2 or Fspin. Thus, in some embodiments, notches of the notch filter 122 can be positioned at Fspin/2, Fspin, and other harmonics thereof. Positions of the notches can be selected by way of a sampling frequency of the notch filter 122.

It will be apparent that the external magnetic field signal component 926 can be separated from other signal components in the signal 122a, 122b of FIG. 1

Referring now to FIG. 10, the five signal components of FIG. 8, which exist at the point E of FIG. 1 are separately treated in the signal channel having the points H and I of FIG. 1

In a first graph 1000, a reference-magnetic-field signal component 1002 is the same as or similar to the reference-magnetic-field signal component 802 of FIG. 8, and is representative of a reference-magnetic-field-responsive signal component of a composite signal at point E of FIG. 1.

In a second graph 1020, an external magnetic field signal component 1022 is the same as or similar to the external magnetic field signal components 804 of FIG. 8, and is representative of an external magnetic field signal component of the composite signal at point E of FIG. 1.

In a third graph 1040, a current spinning offset signal component 1042 is the same as or similar to the current spinning offset signal component 806 of FIG. 8, and is of representative of one offset voltage component of the composite signal at point E of FIG. 1 (see, e.g., offset signal component 314 of FIG. 3).

In a fourth graph 1060, a current spinning offset signal component 1062 is the same as or similar to the current spinning offset signal component 808 of FIG. 8, and is of representative of another offset voltage component of the composite signal at point E of FIG. 1 (see, e.g., offset signal component 316 of FIG. 3).

In a fifth graph 1080, an amplifier offset signal component 1082 is the same as or similar to the amplifier offset signal component 810 of FIG. 8, and is of representative of an amplifier offset voltage component of the composite signal at point E of FIG. 1.

A clock signal, shown in five instances 904, 924, 944, 964, is representative of the clock signal, fM4, of FIG. 1. Unlike the clock signals, fM1, fM2, fM3 described above in conjunction with FIGS. 5, 7, and 9, the clock signal, fM4, has a different frequency, Fspin. In one particular embodiment, the clock signal, fM4, has a rising edge on the start of the second current spinning phase Φ2. The clock signal, fM4, can have fifty percent duty cycle.

In the first graph 1000, a reference-magnetic-field signal component 1006 is representative of operation of the switching modulator 124 of FIG. 1 upon the reference-magnetic-field signal component 1002, resulting in the reference-magnetic-field signal component 1006 at the point labeled H of FIG. 1.

In the second graph 1020, an external magnetic field signal component 1026 is representative of operation of the switching modulator 124 of FIG. 1 upon the external magnetic field signal component 1022, resulting in the external magnetic field signal component 1026 at the point labeled H of FIG. 1.

In the third graph 1040, a current spinning offset signal component 1046 is representative of operation of the switching modulator 124 of FIG. 1 upon the current spinning offset signal component 1042, resulting in the current spinning offset signal component 1046 at the point labeled H of FIG. 1.

In the fourth graph 1060, a current spinning offset signal component 1066 is representative of operation of the switching modulator 124 of FIG. 1 upon the current spinning offset signal component 1062, resulting in the current spinning offset signal component 1066 at the point labeled H of FIG. 1.

In the fifth graph 1080, an amplifier offset signal component 1086 is representative of operation of the switching modulator 124 of FIG. 1 upon the amplifier offset signal component 1082, resulting in the amplifier offset signal component 1086 at the point labeled H of FIG. 1.

The signal components 1006, 1026, 1046, 1066, 1086 combine together to form a composite signal at the point H of FIG. 1.

In FIG. 10, a residual signal component comparable to the residual signal component 318 of FIG. 3 is not shown. However, it will be understood that such a residual signal component can exist at the point H of FIG. 1 and can affect a magnitude of the external magnetic field signal component 1026 (and not the reference-magnetic-field signal component 1006).

By inspection of the signal components 1006, 1026, 1046, 1066, 1086 it will be observed that only the reference-magnetic-filed signal component 1006 is at DC (or at baseband), while the other signal components are at a higher frequency. The reference-magnetic-field signal component 1006 is the only reference-magnetic-field signal component. It will be understood that operation of the low pass filter 126 of FIG. 1 can result in substantially only the reference-magnetic-field signal component 1006 being present at the point I of FIG. 1.

It will be apparent that the reference-magnetic-field signal component 1006 can be separated from other signal components.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
   a reference magnetic field generator, wherein the reference magnetic field generator is configured to generate an alternating current (AC) signal having a first frequency with a first phase and to generate an alternating current (AC) reference magnetic field having the same first frequency with the same first phase;
   a magnetic field sensing circuit comprising at least one magnetic field sensing element, wherein the magnetic field sensing circuit is configured to generate a combined output signal responsive to the alternating current (AC) reference magnetic field and also responsive to an external magnetic field at the same time, wherein the combined signal comprises, at the same time, an alternating current (AC) reference magnetic field signal component and an external magnetic field signal component, and wherein the at least one magnetic field sensing element is responsive to the alternating current (AC) reference magnetic field and, at the same time, is also responsive to the external magnetic field; and
   a signal processing circuit coupled to receive the combined output signal, wherein the signal processing circuit comprises a first modulator, wherein the first modulator is configured to modulate the combined signal with a modulation signal having the same first frequency as the alternating current (AC) signal but with a second phase different than the first phase of the alternating current (AC) signal to generate a modulated combined signal.

2. The magnetic field sensor of claim 1, wherein a difference between the first phase and the second phase is ninety degrees.

3. The magnetic field sensor of claim 1, further comprising:
   a reference modulator coupled to receive a current signal and configured to modulate the current signal to generate the alternating current (AC) signal; and
   at least one coil disposed proximate to the at least one magnetic field sensing element, the at least one coil coupled to receive the alternating current (AC) signal and configured to generate the alternating current (AC) reference magnetic field.

4. The magnetic field sensor of claim 1, wherein the signal processing circuit is further configured to generate a reference field signal responsive to the alternating current (AC) reference magnetic field and not responsive to the external magnetic field and, at the same time, configured to generate an external field signal responsive to the external magnetic field and not responsive to the alternating current (AC) reference magnetic field.

5. The magnetic field sensor of claim 1, wherein the signal processor circuit comprises:
   a first circuit channel, the first circuit channel comprising a second modulator coupled to the first modulator and configured to generate, at baseband, an external field signal responsive to the external magnetic field and not responsive to the alternating current (AC) reference magnetic field, wherein the second modulator is configured to modulate the modulated combined signal; and
   a second circuit channel, the second circuit channel comprising a third modulator coupled to the first modulator and configured to generate, at baseband, a reference field signal responsive to the alternating current (AC) reference magnetic field and not responsive to the external magnetic field, wherein magnetic field sensor is operable to generate the external field signal and the reference field signal at the same time, wherein the third modulator is configured to modulate the modulated combined signal.

6. The magnetic field sensor of claim 5, wherein the second modulator is configured to modulate the modulated combined signal with the same first frequency as the reference magnetic field generator, and wherein the third modulator is configured to modulate the modulated combined signal with a frequency different from first frequency.

7. The magnetic field sensor of claim 5, further comprising a feedback circuit coupled to the second circuit channel and configured to generate a feedback signal coupled to at least one of the magnetic field sensing circuit or the signal processing circuit to control an amplitude of the external field signal according to an amplitude of the reference field signal.

8. The magnetic field sensor of claim 7, wherein the feedback circuit is configured to correct error fluctuations in a transfer characteristic of the magnetic field sensing circuit.

9. The magnetic field sensor of claim 1, wherein the at least one magnetic field sensing element comprises first and second magnetic field sensing elements coupled so as to constructively combine output signals therefrom.

10. The magnetic field sensor of claim 1, wherein the at least one magnetic field sensing element comprises first and second magnetoresistance elements coupled so as to constructively combine output signals therefrom.

11. The magnetic field sensor of claim 1, wherein the at least one magnetic field sensing element comprises first and second Hall elements coupled so as to constructively combine output signals therefrom, wherein the first and second Hall elements are driven in respective coupling arrangements representative of a plurality of different current spinning phases that are each representative of respective current signals diving into the first and second Hall elements in directions that are ninety degrees apart.

12. The magnetic field sensor of claim 1, wherein the at least one magnetic field sensing element comprises first and second Hall elements coupled so as to constructively combine output signals therefrom, wherein the first and second Hall elements are driven in respective coupling arrangements representative of a plurality of different current spinning phases that are each representative of respective current signals diving into the first and second Hall elements in directions that are the same.

13. The magnetic field sensor of claim 1, wherein the at least one magnetic field sensing element comprises at least one Hall element, wherein the magnetic field sensor further comprises: a current spinning module coupled between the at least one at least one magnetic field sensing element and the signal processing circuit, the current spinning module configured to current spin the at least one magnetic field sensing element at a spinning rate having a spinning frequency.

14. The magnetic field sensor of claim 13, wherein the at least one magnetic field sensing element comprises first and second Hall elements coupled so as to constructively combine output signals therefrom, wherein the first and second Hall elements are driven in respective coupling arrangements representative of a plurality of different current spinning phases that are each representative of respective current signals diving into the first and second Hall elements in directions that are ninety degrees apart.

15. A method used on a magnetic field sensor, the method comprising:
generating an alternating current (AC) signal field having a first frequency with a first phase to generate a reference magnetic field having the same first frequency with the same first phase;
generating, with at least one magnetic field sensing element, a combined output signal responsive to the alternating current (AC) reference magnetic field and also responsive to an external magnetic field at the same time, wherein the combined signal comprises, at the same time, an alternating current (AC) reference magnetic field signal component and an external magnetic field signal component, and wherein the at least one magnetic field sensing element is responsive to the alternating current (AC) reference magnetic field and, at the same time, is also responsive to the external magnetic field; and
modulating the combined signal with a modulation signal having the same first frequency as the alternating current (AC) signal but with a second phase different than the first phase of the alternating current (AC) signal to generate a modulated combined signal.

16. The method of claim 15, wherein a difference between the first phase and the second phase is ninety degrees.

17. The method of claim 15, wherein the generating the alternating current (AC) magnetic field comprises:
generating a current signal;
modulating the current signal to generate the alternating current (AC) signal having the first frequency; and
coupling the modulated alternating current (AC) signal to at least one coil disposed proximate to the at least one magnetic field sensing element, the at least one coil configured to generate the alternating current (AC) reference magnetic field.

18. The method of claim 15, further comprising:
generating a reference field signal responsive to the alternating current (AC) reference magnetic field and not responsive to the external magnetic field, wherein the generating the reference field signal comprises modulating the modulated combined signal; and
at the same time, generating an external field signal responsive to the external magnetic field and not responsive to the alternating current (AC) reference magnetic field, wherein the generating the external field signal comprises modulating the modulated combined signal.

19. The method of claim 18, wherein the generating the reference field signal comprises modulating the modulated combined signal with the same first frequency, and, wherein the generating the external field signal comprises modulating the modulated combined signal with a frequency different than the first frequency.

20. The method of claim 18, further comprising:
generating a feedback signal to control an amplitude of the external field signal according to an amplitude of the reference field signal.

21. The method of claim 18, wherein the generating the feedback signal is operable to correct error fluctuations in a transfer characteristic of the magnetic field sensor.

22. The method of claim 15, wherein the at least one magnetic field sensing element comprises first and second magnetic field sensing elements coupled so as to constructively combine output signals therefrom.

23. The method of claim 15, wherein the at least one magnetic field sensing element comprises first and second Hall elements coupled so as to constructively combine output signals therefrom, wherein the first and second Hall elements are driven in respective coupling arrangements representative of a plurality of different current spinning phases that are each representative of respective current signals diving into the first and second Hall elements in directions that are ninety degrees apart.

24. The method of claim 15, wherein the at least one magnetic field sensing element comprises first and second Hall elements coupled so as to constructively combine output signals therefrom, wherein the first and second Hall elements are driven in respective coupling arrangements representative of a plurality of different current spinning phases that are each representative of respective current signals diving into the first and second Hall elements in directions that are the same.

25. The method of claim 15, wherein the at least one magnetic field sensing element comprises at least one Hall element, wherein the generating the combined output signal comprises current spinning the at least one magnetic field sensing element at a spinning rate having a spinning frequency.

26. The method of claim 25, wherein the at least one magnetic field sensing element comprises first and second Hall elements coupled so as to constructively combine output signals therefrom, wherein the first and second Hall elements are driven in respective coupling arrangements representative of a plurality of different current spinning phases that are each representative of respective current signals diving into the first and second Hall elements in directions that are ninety degrees apart.

27. The magnetic field sensor of claim 1, wherein the reference magnetic field generator is configured to generate the alternating current (AC) reference magnetic field having the first frequency and having a first plurality of cycles, each one of the first plurality of cycles having a first phase, and wherein the first modulator is configured to modulate the combined signal with a clock signal having the same first frequency, the clock signal having a second plurality of cycles, each one of the second plurality of cycles having a second phase different than the first phase of the first plurality of cycles.

28. The magnetic field sensor of claim 1, wherein magnetic field sensing elements of the at least one magnetic field sensing element are not coupled in opposition.

29. The magnetic field sensor of claim 1, wherein the at least one magnetic field sensing element is responsive to the alternating current (AC) reference magnetic field and also responsive to the external magnetic field at the same time, irrespective of any residual response.

30. The magnetic field sensor of claim 1, wherein, if the at least one magnetic field sensing element comprises a plurality of magnetic field sensing elements, the plurality of magnetic field sensing elements is coupled together to always constructively add signals from the plurality of magnetic field sensing elements.

31. The method of claim 15, wherein the reference magnetic field generator is configured to generate the alternating current (AC) reference magnetic field having the first frequency and having a first plurality of cycles, each one of the first plurality of cycles having a first phase, and wherein the first modulator is configured to modulate the combined signal with a clock signal having the same first frequency, the clock signal having a second plurality of cycles, each one of the second plurality of cycles having a second phase different than the first phase of the first plurality of cycles.

32. The method of claim 15, wherein magnetic field sensing elements of the at least one magnetic field sensing element are not coupled in opposition.

33. The method of claim 15, wherein the at least one magnetic field sensing element is responsive to the alternating current (AC) reference magnetic field and also responsive to the external magnetic field at the same time, irrespective of any residual response.

34. The method of claim 15, wherein, if the at least one magnetic field sensing element comprises a plurality of magnetic field sensing elements, the plurality of magnetic field sensing elements is coupled together to always constructively add signals from the plurality of magnetic field sensing elements.

* * * * *

UNITED STATES PATENT AND TRADEMARK OFFICE
CERTIFICATE OF CORRECTION

PATENT NO. : 9,645,220 B2
APPLICATION NO. : 14/255166
DATED : May 9, 2017
INVENTOR(S) : Juan Manuel Cesaretti et al.

Page 1 of 2

It is certified that error appears in the above-identified patent and that said Letters Patent is hereby corrected as shown below:

Column 2, Line 15 delete "issued 26, 2008" and replace with --issued February 26, 2008--.

Column 3, Line 20 delete "the self-test all of the circuits" and replace with --the self-test of all of the circuits--.

Column 3, Line 61 delete "to planar Hall elements" and replace with --two Planar Hall elements--.

Column 6, Line 32 to 33 delete "such that it sometimes the current signal" and replace with --such that at sometimes the current signal--.

Column 7, Line 18 delete "by and" and replace with --by an--.

Column 9, Line 43 delete "component are" and replace with --components are--.

Column 11, Line 40 delete "a signal components" and replace with --a signal component--.

Column 11, Lines 41 to 42 delete "and is of representative" and replace with --and is representative of--.

Column 11, Lines 46 to 47 delete "and is of representative" and replace with --and is representative of--.

Column 12, Line 44 delete "Each signal components" and replace with --Each signal component--.

Column 12, Line 49 delete "All or the signal components" and replace with --All of the signal components--.

Columns 12 and 13, Lines 67 to 68 delete "and is of representative of" and replace with --and is representative of--.

Signed and Sealed this
Thirtieth Day of October, 2018

Andrei Iancu
*Director of the United States Patent and Trademark Office*

Column 13, Lines 6 to 7 delete "and is of representative of" and replace with --and is representative of--.

Column 13, Line 10 delete "and amplifier offset" and replace with --an amplifier offset--.

Column 13, Line 12 delete "is of representative of" and replace with --is representative of--.

Column 14, Lines 36 to 37 delete "is of representative of" and replace with --is representative of--.

Column 14, Lines 42 to 43 delete "is of representative of" and replace with --is representative of--.

Column 14, Line 48 delete "is of representative of" and replace with --is representative of--.

Column 17, Lines 38 to 39 delete "the at least one at least one" and replace with --the at the least one--.